(12) United States Patent
Olson et al.

(10) Patent No.: US 9,670,300 B2
(45) Date of Patent: *Jun. 6, 2017

(54) COPOLYMERS INCLUDING ULTRAVIOLET ABSORBING GROUPS AND FLUOROPOLYMER COMPOSITIONS INCLUDING THEM

(71) Applicant: 3M INNOVATIVE PROPERTIES COMPANY, St. Paul, MN (US)

(72) Inventors: David B. Olson, Hudson, WI (US); Patricia M. Savu, Maplewood, MN (US); Timothy J. Hebrink, Scandia, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/654,121

(22) PCT Filed: Dec. 20, 2013

(86) PCT No.: PCT/US2013/076840
§ 371 (c)(1),
(2) Date: Jun. 19, 2015

(87) PCT Pub. No.: WO2014/100551
PCT Pub. Date: Jun. 26, 2014

(65) Prior Publication Data
US 2015/0353662 A1    Dec. 10, 2015

Related U.S. Application Data

(60) Provisional application No. 61/740,125, filed on Dec. 20, 2012.

(51) Int. Cl.
| | | |
|---|---|---|
| *C08F 220/10* | (2006.01) | |
| *H01L 31/0203* | (2014.01) | |
| *C08F 220/22* | (2006.01) | |
| *C08F 220/34* | (2006.01) | |
| *C08J 5/18* | (2006.01) | |
| *C08F 220/14* | (2006.01) | |
| *C08L 33/10* | (2006.01) | |
| *C08F 220/30* | (2006.01) | |

(52) U.S. Cl.
CPC .......... *C08F 220/10* (2013.01); *C08F 220/14* (2013.01); *C08F 220/22* (2013.01); *C08F 220/34* (2013.01); *C08J 5/18* (2013.01); *C08L 33/10* (2013.01); *H01L 31/0203* (2013.01); *C08F 2220/303* (2013.01); *C08J 2327/16* (2013.01); *C08J 2333/10* (2013.01); *C08J 2333/16* (2013.01); *C08J 2427/16* (2013.01); *C08J 2433/12* (2013.01)

(58) Field of Classification Search
CPC .... C08F 220/10; C08F 220/14; C08F 220/22; C08F 220/34; C08F 2220/346; C08F 2220/302; C08J 5/18; H01L 31/0203
See application file for complete search history.

(56) References Cited

U.S. PATENT DOCUMENTS

| | | | |
|---|---|---|---|
| 2,803,615 A | 8/1957 | Albrecht | |
| RE24,906 E | 12/1960 | Ulrich | |
| 3,553,179 A | 1/1971 | Bartlett | |
| 4,329,384 A | 5/1982 | Vesley et al. | |
| 4,330,590 A | 5/1982 | Vesley | |
| 4,379,201 A | 4/1983 | Heilmann et al. | |
| 4,696,719 A | 9/1987 | Bischoff | |
| 4,722,515 A | 2/1988 | Ham | |
| 4,737,559 A | 4/1988 | Kellen et al. | |
| 4,842,893 A | 6/1989 | Yializis et al. | |
| 4,954,371 A | 9/1990 | Yializis | |
| 5,018,048 A | 5/1991 | Shaw et al. | |
| 5,032,461 A | 7/1991 | Shaw et al. | |
| 5,073,611 A | 12/1991 | Rehmer et al. | |
| 5,084,537 A * | 1/1992 | Stoyan ................. | C08F 220/24 523/106 |
| 5,097,800 A | 3/1992 | Shaw et al. | |
| 5,125,138 A | 6/1992 | Shaw et al. | |
| 5,157,091 A | 10/1992 | Masataka | |
| 5,198,498 A | 3/1993 | Valet et al. | |
| 5,254,608 A | 10/1993 | McClure | |
| 5,286,781 A | 2/1994 | Gotoh | |
| 5,420,204 A | 5/1995 | Valet et al. | |
| 5,440,446 A | 8/1995 | Shaw et al. | |
| 5,547,908 A | 8/1996 | Furuzawa et al. | |
| 6,045,864 A | 4/2000 | Lyons et al. | |
| 6,214,422 B1 | 4/2001 | Yializis | |
| 6,231,939 B1 | 5/2001 | Shaw et al. | |

(Continued)

FOREIGN PATENT DOCUMENTS

| | | |
|---|---|---|
| EP | 870778 | 10/1998 |
| EP | 0939441 | 9/1999 |

(Continued)

OTHER PUBLICATIONS

International Search report for PCT International Application No. PCT/US2013/076840 mailed on Apr. 22, 2014, 3 pages.
D. G. Shaw and M. G. Langlois, "A New Vapor Deposition Process for Coating Paper and Polymer Webs", 6th International Vacuum Coating Conference, Oct. 28, 1992; pp. 18-24.
D. G. Shaw and M. G. Langlois, "A New High Speed Process for Vapor Depositing Acrylate Thin Films: An Update", Society of Vacuum Coaters 36th Annual Technical Conference Proceedings, Apr. 25-30, 1993, pp. 348-352.
D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994), pp. 240-247.
D. G. Shaw, M. Roehrig, M. G. Langlois and C. Sheehan, "Use of Evaporated Acrylate Coatings to Smooth the Surface of Polyester and Polypropylene Film Substrates", RadTech (1996), 96 North America UV/EB Conference Proceedings, Apr. 28-May 2, 1996, vol. 2, pp. 701-707.

(Continued)

*Primary Examiner* — Nathan M Nutter

(57) ABSTRACT

A thermoplastic copolymer that includes a first divalent unit having a pendent ultraviolet absorbing group and a second divalent unit that is fluorinated. A fluoropolymer composition including the thermoplastic copolymer is also disclosed.

20 Claims, No Drawings

(56) References Cited

U.S. PATENT DOCUMENTS

| | | |
|---|---|---|
| 6,251,521 B1 | 6/2001 | Eian |
| 6,261,676 B1 | 7/2001 | Olson et al. |
| 6,312,802 B1 | 11/2001 | Nishida et al. |
| 6,335,102 B1 | 1/2002 | Tsubaki et al. |
| 6,414,236 B1 | 7/2002 | Katalka et al. |
| 6,582,790 B2 | 6/2003 | Olson et al. |
| 6,664,354 B2 | 12/2003 | Savu |
| 6,777,079 B2 | 8/2004 | Zhou et al. |
| 6,923,921 B2 | 8/2005 | Flynn |
| 7,018,713 B2 | 3/2006 | Padiyath et al. |
| 7,101,618 B2 | 9/2006 | Coggio |
| 7,682,771 B2 | 3/2010 | Liu et al. |
| 7,993,680 B2 | 8/2011 | Clemente |
| 2004/0191550 A1 | 9/2004 | Maekawa et al. |
| 2005/0129569 A1 | 6/2005 | Zhao et al. |
| 2007/0166562 A1 | 7/2007 | Swei et al. |
| 2009/0283144 A1 | 11/2009 | Hebrink |
| 2010/0055418 A1 | 3/2010 | Takamatsu et al. |
| 2010/0189983 A1 | 7/2010 | Numrich |
| 2011/0151229 A1 | 6/2011 | Morita |
| 2011/0297228 A1 | 12/2011 | Li |
| 2012/0003451 A1 | 1/2012 | Weigel |
| 2012/0003484 A1 | 1/2012 | Roehrig |
| 2012/0011850 A1 | 1/2012 | Hebrink |
| 2012/0097220 A1 | 4/2012 | Miyashita et al. |
| 2012/0227809 A1 | 9/2012 | Bharti |
| 2015/0337096 A1* | 11/2015 | Olson et al. .......... C08F 220/24 525/200 |

FOREIGN PATENT DOCUMENTS

| | | |
|---|---|---|
| EP | 1065731 | 1/2001 |
| EP | 1311637 | 5/2003 |
| JP | 0923992 | 9/1978 |
| JP | 4216807 | 8/1992 |
| JP | 07-003242 | 1/1995 |
| JP | 9-59560 | 3/1997 |
| JP | 09239921 | 9/1997 |
| JP | 10-07998 | 1/1998 |
| JP | 10-53681 | 2/1998 |
| JP | 10-168408 | 6/1998 |
| JP | 10-279832 | 10/1998 |
| JP | 11-293180 | 10/1999 |
| JP | 11-293181 | 10/1999 |
| JP | 11-348199 | 12/1999 |
| JP | 2000-123621 | 4/2000 |
| JP | 2001-001478 | 1/2001 |
| JP | 2001-019895 | 1/2001 |
| JP | 2001-123107 | 5/2001 |
| JP | 2002-194266 | 7/2002 |
| JP | 2003-40937 | 2/2003 |
| JP | 2003-266449 | 9/2003 |
| JP | 2004-148542 | 5/2004 |
| JP | 2004-161800 | 6/2004 |
| JP | 2005-042019 | 2/2005 |
| JP | 2005-187662 | 7/2005 |
| JP | 2005-290269 | 10/2005 |
| JP | 2011-68708 | 4/2011 |
| JP | 2012-188620 | 10/2012 |
| KR | 2009-0089088 | 8/2009 |
| WO | WO 00-26973 | 5/2000 |
| WO | WO 2011-071847 | 6/2011 |
| WO | WO 2011-113008 | 9/2011 |
| WO | WO 2013-096543 | 6/2013 |
| WO | WO 2013-172930 | 11/2013 |
| WO | WO 2014-025983 | 2/2014 |
| WO | WO 2015-200655 | 12/2015 |
| WO | WO 2015-200657 | 12/2015 |
| WO | WO 2015-200669 | 12/2015 |

OTHER PUBLICATIONS

J. Affinito, P. Martin, M. Gross, C. Coronado and E. Greenwell, "Vacuum deposited polymer/metal multilayer films for optical application", Thin Solid Films 270, 43-48 (1995).

J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996), pp. 392-397.

Handbook of Pressure Sensitive Adhesive Technology, Donatas Satas (Ed.), 2nd Edition, p. 172, Van Nostrand Reinhold, New York, NY, 1989.

\* cited by examiner

COPOLYMERS INCLUDING ULTRAVIOLET ABSORBING GROUPS AND FLUOROPOLYMER COMPOSITIONS INCLUDING THEM

CROSS REFERENCE TO RELATED APPLICATION

This application is a national stage filing under 35 U.S.C. 371 of PCT/US2013/076840, filed Dec. 20, 2013, which claims priority to U.S. Provisional Application No. 61/740,125, filed Dec. 20, 2012, the disclosure of which is incorporated by reference in its entirety herein.

BACKGROUND

Fluoropolymers are known to have a variety of useful properties, including cleanability, weather resistance, and chemical resistance. Such beneficial properties render fluoropolymers useful, for example, for a variety of outdoor applications including signage, films or coatings for architectural coverings, and protective coverings for photovoltaic modules.

It may be desirable to incorporate ultraviolet absorbers (UVAs) into materials exposed to ultraviolet (UV) radiation, for example, to protect a topcoat or topsheet or an underlying substrate or adhesive from UV degradation. Some UVAs can be dispersed into some compositions, but sometimes they can be lost due to volatilization or migration to the surface. Covalent incorporation of UVAs into certain compositions has been proposed. See, e.g., U.S. Pat. Appl. Pub. No. 2011/0297228 (Li et al.).

It has been reported that common UVAs can be incompatible with fluoropolymers. See, e.g., U.S. Pat. No. 6,251,521 (Eian et al.). This incompatibility can lead to degradation of physical or optical properties (e.g., loss of clarity or increased fogginess) as well as increased or accelerated loss of the UVA by migration, bleeding, or blooming.

SUMMARY

The present disclosure provides a copolymer that includes a first divalent unit with a pendent ultraviolet absorbing group and a second divalent unit that is fluorinated. These copolymers are generally quite compatible with fluoropolymers such that the copolymers and fluoropolymers are readily blended together. Compositions including the fluoropolymers and copolymers provide protection to ultraviolet light and have good transparency to visible and infrared light. These properties are typically well maintained even after accelerated UV exposure and exposure to high temperature and humidity conditions.

In one aspect, the present disclosure provides a copolymer that includes a first divalent unit having a pendent ultraviolet absorbing group and a second divalent unit represented by formula:

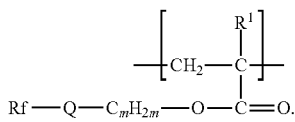

In this formula, Rf represents a fluoroalkyl group having from 1 to 6 carbon atoms optionally interrupted by one —O— group, or Rf represents a polyfluoropolyether group. $R^1$ is hydrogen or methyl. Q is a bond, —SO$_2$—N(R)—, or —C(O)—N(R)—, wherein R is alkyl having from 1 to 4 carbon atoms or hydrogen, and m is an integer from 0 to 11. The copolymer is a thermoplastic copolymer.

In another aspect, the present disclosure provides a composition comprising a fluoropolymer and the copolymer in any of its embodiments described above or below.

In another aspect, the present disclosure provides a method of making a composition. The method includes blending the copolymer in any of its embodiments described above or below with a fluoropolymer to make the composition.

In another aspect, the present disclosure provides a method of making a film. The method includes providing the composition in any of its embodiments and extruding the composition into a film.

As described above, compositions including the fluoropolymers and copolymers typically provide protection to ultraviolet light and have good transparency to visible and infrared light. Accordingly, the present disclosure provides a photovoltaic device include the composition according to the present disclosure in any of its embodiments.

In this application:

Terms such as "a", "an" and "the" are not intended to refer to only a singular entity, but include the general class of which a specific example may be used for illustration. The terms "a", "an", and "the" are used interchangeably with the term "at least one".

The phrase "comprises at least one of" followed by a list refers to comprising any one of the items in the list and any combination of two or more items in the list. The phrase "at least one of" followed by a list refers to any one of the items in the list or any combination of two or more items in the list.

The term "ultraviolet absorbing group" refers to a covalently attached ultraviolet absorber (UVA). UVAs are known to those skilled in the art as being capable of dissipating absorbed light energy from UV rays as heat by reversible intramolecular proton transfer. UVAs are selected such that the copolymer in any of the embodiments of copolymers or second copolymers disclosed herein absorbs at least 70%, 80%, or 90% of incident light in a wavelength range from 180 nanometers (nm) to 400 nm.

"Alkyl group" and the prefix "alk-" are inclusive of both straight chain and branched chain groups and of cyclic groups. Unless otherwise specified, alkyl groups herein have up to 20 carbon atoms. Cyclic groups can be monocyclic or polycyclic and, in some embodiments, have from 3 to 10 ring carbon atoms.

The phrase "interrupted by at least one —O— group", for example, with regard to an alkyl (which may or may not be fluorinated), alkylene, or arylalkylene refers to having part of the alkyl, alkylene, or arylalkylene on both sides of the —O— group. For example, —CH$_2$CH$_2$—O—CH$_2$—CH$_2$— is an alkylene group interrupted by an —O—.

The term "fluoroalkyl group" includes linear, branched, and/or cyclic alkyl groups in which all C—H bonds are replaced by C—F bonds as well as groups in which hydrogen or chlorine atoms are present instead of fluorine atoms. In some embodiments, up to one atom of either hydrogen or chlorine is present for every two carbon atoms.

The term "polymer" refers to a molecule having a structure which essentially includes the multiple repetition of units derived, actually or conceptually, from molecules of low relative molecular mass. The term "polymer" encompasses oligomers.

All numerical ranges are inclusive of their endpoints and nonintegral values between the endpoints unless otherwise stated.

DETAILED DESCRIPTION

Copolymers according to the present disclosure are linear or branched copolymers. Typically, they are linear copolymers. They may be random copolymers or block copolymers. They are not covalently crosslinked, and therefore may be considered thermoplastic. Accordingly, they may be dissolved in solvents and have measurable molecular weights as opposed to covalently crosslinked polymers, which cannot be dissolved in solvents and molecular weights approaching infinity. Thermoplastics are also typically melt-processable such as by an extrusion process. Copolymers according to the present disclosure typically have weight average molecular weights in a range from 1000 grams per mole to 100,000 grams per mole. In some embodiments, the weight average molecular weight is at least 2000, 3000, 4000, 5000, 6000, 7000, 8000, 9000, or 10000 grams per mole up to 30,000, 40,000, 50,000, 60,000, 70,000, 80,000, or up to 90,000 grams per mole. In some embodiments, the copolymer has a number average molecular weight of up to 50,000 grams per mole. In these embodiments, the copolymer can be considered an oligomer. In some of these embodiments, the copolymer has a number average molecular weight of up to 40,000, 30,000, 20,000, or less than 20,000 grams per mole (e.g., up to 19,500, 19,000, or 18,500 grams per mole). In any of the embodiments in which the copolymer is an oligomer, its number average molecular weight may be greater than 5,000 grams per mole or greater than 7,500 grams per mole. Copolymers disclosed herein typically have a distribution of molecular weights and compositions. Weight and number average molecular weights can be measured, for example, by gel permeation chromatography (i.e., size exclusion chromatography) using techniques known to one of skill in the art.

Copolymers according to the present disclosure in any of their embodiments include a first divalent unit comprising a pendent ultraviolet absorbing (UVA) group. Any class of UVA may be useful for providing the UVA group. Examples of useful classes include benzophenones, benzotriazoles, triazines, cinnamates, cyanoacrylates, dicyano ethylenes, salicylates, oxanilides, and para-aminobenzoates. In some embodiments, the pendent ultraviolet absorbing group comprises a triazine, a benzophenone, or a benzotriazole. In some embodiments, the pendent ultraviolet absorbing group is a triazine. In some embodiments, the pendent ultraviolet absorbing group has enhanced spectral coverage in the long-wave UV region (e.g., 315 nm to 400 nm), enabling it to block the high wavelength UV light that can cause yellowing in polymers. The first divalent unit can be considered to be a repeating unit in the copolymer disclosed herein. The first divalent unit may be represented by formula -[—CH$_2$—C(H)UVA-]-, -[—CH$_2$—C(H)C(O)—O—X-UVA-]-, -[—CH$_2$—C(H)C(O)—NH—X—UVA-]-, -[—CH$_2$—C(CH$_3$)C(O)—O—X—UVA-]-, or -[—CH$_2$—C(CH$_3$)C(O)—NH—X—UVA-]-, wherein X is an alkylene or alkyleneoxy group having from 1 to 10 (in some embodiments, 2 to 6 or 2 to 4) carbon atoms and optionally interrupted by one or more —O— groups and optionally substituted by a hydroxyl group, and wherein UVA includes any of the above embodiments of UVA groups. In the alkyleneoxy group, the oxygen is attached to the UVA group. The copolymer may include (e.g., at least 2, 3, 4, 5, 6, 7, 8, 9, 10, 15, or at least 20 up to 30, 35, 40, 45, 50, 100, or up to 200) of these repeating units. The repeating unit can be derived from a substituted vinyl, substituted acrylate, or substituted methacrylate group.

In some embodiments, the first divalent unit is represented by formula:

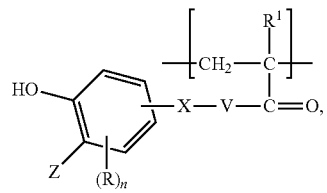

wherein $R^1$ is hydrogen or methyl, V is O or NH, X is alkylene or alkyleneoxy group having from 1 to 10 (in some embodiments, 2 to 6 or 2 to 4) carbon atoms and optionally interrupted by one or more —O— groups and optionally substituted by a hydroxyl group, R is alkyl (e.g., having from one to four carbon atoms), n is 0 or 1, and Z is a benzoyl group, a 4,6-bisphenyl[1,3,5]triazin-2-yl group, or a 2H-benzotriazol-2-yl group, wherein the benzoyl group, 4,6-bisphenyl[1,3,5]triazin-2yl group, and 2H-benzotriazol2-yl group is optionally substituted by one or more alkyl, aryl, alkoxy, hydroxyl, or halogen substituents, or a combination of these substituents. In some embodiments, the alkyl and/or alkoxy substituent independently has 1 to 4 or 1 to 2 carbon atoms. In some embodiments, each halogen substituent is independently a chloro, bromo, or iodo group. In some embodiments, each halogen substituent is a chloro group. The term "aryl" as used herein includes carbocyclic aromatic rings or ring systems, for example, having 1, 2, or 3 rings and optionally containing at least one heteroatom (e.g., O, S, or N) in the ring. Examples of aryl groups include phenyl, naphthyl, biphenyl, fluorenyl as well as furyl, thienyl, pyridyl, quinolinyl, isoquinolinyl, indolyl, isoindolyl, triazolyl, pyrrolyl, tetrazolyl, imidazolyl, pyrazolyl, oxazolyl, and thiazolyl. In the alkyleneoxy group, the oxygen is attached to the substituted benzene ring. In some embodiments, each V is O and X is ethylene, propylene, butylene, ethyleneoxy, propyleneoxy, or butyleneoxy, with the oxygen attached to the substituted benzene ring. In some embodiments, n is 0. In some embodiments, R is methyl, ethyl, n-propyl, isopropyl, n-butyl, isobutyl, s-butyl, or t-butyl, and n is 1. In some embodiments, Z is an unsubstituted benzoyl group. In some embodiments, Z is 4,6-bis(2,4-dimethylphenyl)[1,3,5]triazin-2-yl; 4,6-bis(2,4-diethylphenyl)[1,3,5]triazin-2-yl; 4,6-bis(2,4-dimethoxyphenyl)[1,3,5]triazin-2-yl; or 4,6-bis(2,4-diethoxyphenyl)[1,3,5]triazin-2-yl. In some embodiments, Z is 2H-benzotriazol-2-yl or 5-chloro-2H-benzotriazol-2-yl.

Copolymers disclosed herein in any of their embodiments include (e.g., at least 1, 2, 3, 4, 5, 6, 7, 8, 9, 10, 15, or at least 20 up to 30, 35, 40, 45, 50, 100, or up to 200) second divalent units independently represented by formula:

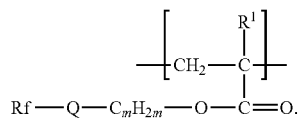

For divalent units having this formula, Q is a bond, —SO$_2$N(R)—, or —C(O)—N(R)— wherein R is alkyl having 1 to 4 carbon atoms (e.g., methyl, ethyl, n-propyl, isopropyl, n-butyl, or isobutyl) or hydrogen. In some embodiments, Q is a bond. In some embodiments, Q is —SO$_2$N(R)—. In some of these embodiments, R is methyl or ethyl. m is an integer from 1 to 11 (i.e., 1, 2, 3, 4, 5, 6, 7, 8, 9, 10, or 11). In some of these embodiments, m is 1; in other of these embodiments, m is 2. In some embodiments wherein Q is —SO$_2$N(R)—, m is an integer from 2 to 11, 2 to 6, or 2 to 4. In some embodiments wherein Q is a bond, m is an integer from 1 to 6, 1 to 4, or 1 to 2. In embodiments wherein Q is a bond, it should be understood that the second divalent units may also be represented by formula:

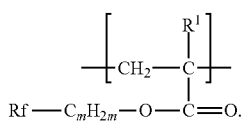

In some embodiments, copolymers disclosed herein, including any of the embodiments described above in connection to the first divalent units, comprise (e.g., at least 2, 3, 4, 5, 6, 7, 8, 9, 10, 15, or at least 20 up 30, 35, 40, 45, 50, 100, or up to 200) second divalent units independently represented by formula:

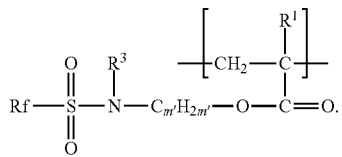

For divalent units of this formula, m' is an integer from 2 to 11 (i.e., 2, 3, 4, 5, 6, 7, 8, 9, 10, or 11). In some embodiments, m' is an integer from 2 to 6 or 2 to 4. $R^3$ is alkyl having 1 to 4 carbon atoms (e.g., methyl, ethyl, n-propyl, isopropyl, n-butyl, or isobutyl) or hydrogen. In some embodiments, $R^3$ is methyl or ethyl.

For any of the embodiments of the second divalent units, each Rf independently represents a fluorinated alkyl group having from 1 to 6 (in some embodiments, 2 to 6 or 2 to 4) carbon atoms (e.g., trifluoromethyl, perfluoroethyl, 1,1,2,2-tetrafluoroethyl, 2-chlorotetrafluoroethyl, perfluoro-n-propyl, perfluoroisopropyl, perfluoro-n-butyl, 1,1,2,3,3,3-hexafluoropropyl, perfluoroisobutyl, perfluoro-sec-butyl, or perfluoro-tert-butyl, perfluoro-n-pentyl, pefluoroisopentyl, or perfluorohexyl). In some embodiments, Rf is perfluorobutyl (e.g., perfluoro-n-butyl, perfluoroisobutyl, or perfluoro-sec-butyl). In some embodiments, Rf is perfluoropropyl (e.g., perfluoro-n-propyl or perfluoroisopropyl). The copolymer may include a mixture of fluorinated monomers having different Rf fluoroalkyl groups (e.g., with an average of up to 6 or 4 carbon atoms).

In some embodiments, in copolymers disclosed herein, including any of the embodiments described above in connection to the first divalent units, Rf is a polyfluoropolyether group. The term "polyfluoroether" refers to a compound or group having at least 3 (in some embodiments, at least 4, 5, 6, 7, 8, 9, 10, 11, 12, 13, 14, 15, 16, 17, 18, 19, or even 20) carbon atoms and at least 1 (in some embodiments, at least 2, 3, 4, 5, 6, 7, or even 8) ether linkages, wherein hydrogen atoms on the carbon atoms are replaced with fluorine atoms. In some embodiments, Rf has up to 100, 110, 120, 130, 140, 150, or even 160 carbon atoms and up to 25, 30, 35, 40, 45, 50, 55, or even 60 ether linkages.

In some embodiments, including embodiments wherein Rf is a polyfluoroether group, copolymers according to the present disclosure comprise (e.g., at least 2, 3, 4, 5, 6, 7, 8, 9, 10, 15, or at least 20 up 30, 35, 40, 45, 50, 100, or up to 200) second divalent units independently represented by formula:

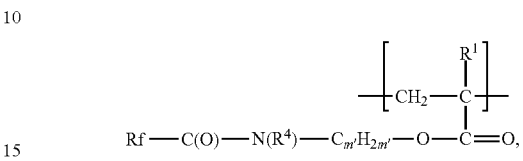

For divalent units of this formula, m' is an integer from 2 to 11 (i.e., 2, 3, 4, 5, 6, 7, 8, 9, 10, or 11). In some embodiments, m' is an integer from 2 to 6 or 2 to 4. $R^4$ is alkyl having 1 to 4 carbon atoms (e.g., methyl, ethyl, n-propyl, isopropyl, n-butyl, or isobutyl) or hydrogen. In some embodiments, $R^4$ is methyl or ethyl. In some embodiments, $R^4$ is hydrogen.

The polyfluoroether group Rf can be linear, branched, cyclic, or combinations thereof and can be saturated or unsaturated. Polyfluoroether groups include those in which hydrogen or chlorine atoms are present instead of fluorine atoms with typically up to one atom of either hydrogen or chlorine is present for every two carbon atoms. The copolymer may include a mixture of fluorinated monomers having different Rf polyfluoroether groups. In some embodiments, the polyfluoroether group is a perfluoropolyether group (i.e., all of the hydrogen atoms on the carbon atoms are replaced with fluorine atoms). Exemplary perfluoropolyethers include perfluorinated repeating units represented by at least one of —(C$_d$F$_{2d}$)—, —(C$_d$F$_{2d}$O)—, —(CF(L'))-, —(CF(L')O)—, —(CF(L')C$_d$F$_{2d}$O)—, —(C$_d$F$_{2d}$CF(L')O)—, or —(CF$_2$CF(L')O)—. In these repeating units, d is typically an integer from 1 to 10. In some embodiments, d is an integer from 1 to 8, 1 to 6, 1 to 4, or 1 to 3. The L' group can be a perfluoroalkyl group optionally interrupted by at least one ether linkage or a perfluoroalkoxy group, each of which may be linear, branched, cyclic, or a combination thereof. The L' group typically has up to 12 (in some embodiments, up to 10, 8, 6, 4, 3, 2, or 1) carbon atoms. In some embodiments, the L' group can have up to 4 (in some embodiments, up to 3, 2, or 1) oxygen atoms; in some embodiments L' has no oxygen atoms. In these perfluoropolyether structures, different repeating units can be combined in a block or random arrangement to form the Rf group.

In some embodiments, Rf is represented by formula $R_f^a$—O—($R_f^b$—O—)$_z$($R_f^c$)—, wherein $R_f^a$ is a perfluoroalkyl having 1 to 10 (in some embodiments, 1 to 6, 1 to 4, 2 to 4, or 3) carbon atoms; each $R_f^b$ is independently a perfluoroalkylene having 1 to 4 (i.e., 1, 2, 3, or 4) carbon atoms; $R_f^c$ is a perfluoroalkylene having 1 to 6 (in some embodiments, 1 to 4 or 2 to 4) carbon atoms; and z' is in a range from 2 to 50 (in some embodiments, 2 to 25, 2 to 20, 3 to 20, 3 to 15, 5 to 15, 6 to 10, or 6 to 8). Representative $R_f^a$ groups include CF$_3$—, CF$_3$CF$_2$—, CF$_3$CF$_2$CF$_2$—, CF$_3$CF(CF$_3$)—, CF$_3$CF(CF$_3$)CF$_2$—, CF$_3$CF$_2$CF$_2$CF$_2$—, CF$_3$CF$_2$CF(CF$_3$)—, CF$_3$CF$_2$CF(CF$_3$)CF$_2$—, and CF$_3$CF(CF$_3$)CF$_2$CF$_2$—. In some embodiments, $R_f^a$ is CF$_3$CF$_2$CF$_2$—. Representative $R_f^b$ groups include —CF$_2$—, —CF(CF$_3$)—, —CF$_2$CF$_2$—, —CF(CF$_3$)CF$_2$—, —CF$_2$CF$_2$CF$_2$—, —CF(CF$_3$)CF$_2$CF$_2$—, —CF$_2$CF$_2$CF$_2$CF$_2$—, and —CF$_2$C(CF$_3$)$_2$—. Representative $R_f^c$ groups include $-CF_2-$, $-CF(CF_3)-$, $-CF_2CF_2-$, $-CF_2CF_2CF_2-$, and $-CF(CF_3)CF_2-$. In some embodiments, $R_f^c$ is $-CF(CF_3)-$.

In some embodiments, $(R_f^b-O-)_z$, is represented by $-[CF_2O]_i[CF_2CF_2O]_j-$, $-[CF_2O]_i[CF(CF_3)CF_2O]_j-$, $-[CF_2O]_i[CF_2CF_2CF_2O]_j-$, $-[CF_2CF_2O]_i[CF_2O]_j-$, $-[CF_2CF_2O]_i[CF(CF_3)CF_2O]_j-$, $-[CF_2CF_2O]_i[CF_2CF_2CF_2O]_j-$, $-[CF_2CF_2CF_2O]_i[CF(CF_3)O]_j-$, and $[CF_2CF_2CF_2O]_i[CF(CF_3)CF_2O]_j-$, wherein i+j is an integer of at least 3 (in some embodiments, at least 4, 5, or 6).

In some embodiments, Rf is selected from the group consisting of $C_3F_7O(CF(CF_3)CF_2O)_kCF(CF_3)-$, $C_3F_7O(CF_2CF_2CF_2O)_kCF_2CF_2-$, or $CF_3O(C_2F_4O)_gCF_2-$, wherein k has an average value in a range from 3 to 50 (in some embodiments, 3 to 25, 3 to 15, 3 to 10, 4 to 10, or 4 to 7), and wherein g has an average value in a range from 6 to 50 (in some embodiments, 6 to 25, 6 to 15, 6 to 10, 7 to 10, or 8 to 10). In some of these embodiments, Rf is $C_3F_7O(CF(CF_3)CF_2O)_kCF(CF_3)-$, wherein k has an average value in a range from 4 to 7. In some embodiments, Rf is selected from the group consisting of $CF_3O(CF_2O)_{x'}(C_2F_4O)_{y'}CF_2-$ and $F(CF_2)_3-O-(C_4F_8O)_{z'}(CF_2)_3-$, wherein x', y', and z' each independently has an average value in a range from 3 to 50 (in some embodiments, 3 to 25, 3 to 15, 3 to 10, or even 4 to 10).

In some embodiments, Rf is a polyfluoropolyether group that has a weight average molecular weight of at least 750 (in some embodiments at least 850 or even 1000) grams per mole. In some embodiments, Rf has a weight average molecular weight of up to 6000 (in some embodiments, 5000 or even 4000) grams per mole. In some embodiments, Rf has a weight average molecular weight in a range from 750 grams per mole to 5000 grams per mole. Weight average molecular weights can be measured, for example, by gel permeation chromatography (i.e., size exclusion chromatography) using techniques known in the art.

Copolymers according to the present disclosure can be prepared, for example, by polymerizing a mixture of components typically in the presence of an initiator. By the term "polymerizing" it is meant forming a polymer or oligomer that includes at least one identifiable structural element due to each of the components. Typically, preparing the copolymer includes combining components comprising at least a first monomer having an ultraviolet absorbing group and at least a second monomer that is a fluorinated monomer.

Suitable first monomers are those that include benzophenone, benzotriazole, triazine, cinnamate, cyanoacrylate, dicyano ethylene, salicylate, oxanilide, or para-aminobenzoate groups. Examples of suitable first monomers include 2-(cyano-β,β-biphenylacryloyloxy)ethyl-1-methacrylate, 2-(α-cyano-β,β-biphenylacryloyloxy)ethyl-2-methacrylamide, N-(4-methacryloylphenol)-N'-(2-ethylphenyl)oxamide, vinyl 4-ethyl-α-cyano-β-phenylcinnamate, 2-hydroxy-4-(2-hydroxy-3-methacryloyloxypropoxy)benzophenone, 2-hydroxy-4-methacryloyloxybenzophenone, 2-hydroxy-4-(2-acryloyloxyethoxy)benzophenone, 2-hydroxy-4-(4-acryloyloxybutoxy)benzophenone, 2,2'-dihydroxy-4-(2-acryloyloxyethoxy)benzophenone, 2-hydroxy-4-(2-acryloyloxyethoxy)-4'-(2-hydroxyethoxy)benzophenone, 4-(allyloxy)-2-hydroxybenzophenone, 2-(2'-hydroxy-3'-methacrylamidomethyl-5'-octylphenyl)benzotriazole, 2-(2-hydroxy-5-vinylphenyl)-2-benzotriazole, 2-(2H-benzotriazol-2-yl)-4-methyl-6-(2-propenyl)phenol, 2-(2'-hydroxy-5'-methacryloyloxyethylphenyl)-2H-benzotriazole, 2-(2'-hydroxy-5'-methacryloyloxyethylphenyl)-5-chloro-2H-benzotriazole, 2-(2'-hydroxy-5'-methacryloyloxypropylphenyl)-2H-benzotriazole, 2-(2'-hydroxy-5'-methacryloyloxypropylphenyl)-5-chloro-2H-benzotriazole, 2-(2'-hydroxy-3'-tert-butyl-5'-methacryloyloxyethylphenyl)-2H-benzotriazole, 2-(2'-hydroxy-3'-tertbutyl-5'-methacryloyloxyethylphenyl)-5-chloro-2H-benzotriazole, 2,4-diphenyl-6-[2-hydroxy-4-(2-acryloyloxyethoxy)]-1,3,5-triazine, 2,4-bis(2-methylphenyl)-6-[2-hydroxy-4-(2-acryloyloxyethoxy)]-1,3,5-triazine, 2,4-bis(2-methoxyphenyl)-6-[2-hydroxy-4-(2-acryloyloxyethoxy)]-1,3,5-triazine, 2,4-bis(2-ethylphenyl)-6-[2-hydroxy-4-(2-acryloyloxyethoxy)]-1,3,5-triazine, 2,4-bis(2-ethoxyphenyl)-6-[2-hydroxy-4-(2-acryloyloxyethoxy)]-1,3,5-triazine, 2,4-diphenyl-6-[2-hydroxy-4-(2-methacryloyloxyethoxy)]-1,3,5-triazine, 2,4-bis(2-methylphenyl)-6-[2-hydroxy-4-(2-methacryloyloxyethoxy)]-1,3,5-triazine, 2,4-bis(2-methoxyphenyl)-6-[2-hydroxy-4-(2-methacryloyloxyethoxy)]-1,3,5-triazine, 2,4-bis(2-ethylphenyl)-6-[2-hydroxy-4-(2-methacryloyloxyethoxy)]-1,3,5-triazine, 2,4-bis(2-ethoxyphenyl)-6-[2-hydroxy-4-(2-methacryloyloxyethoxy)]-1,3,5-triazine, 2,4-bis(2,4-dimethoxyphenyl)-6-[2-hydroxy-4-(2-acryloyloxyethoxy)]-1,3,5-triazine, 2,4-bis(2,4-dimethylphenyl)-6-[2-hydroxy-4-(2-acryloyloxyethoxy)]-1,3,5-triazine, 2,4-bis(2,4-diethoxyphenyl)-6-[2-hydroxy-4-(2-acryloyloxyethoxy)]-1,3,5-triazine, 2,4-bis(2,4-diethylphenyl)-6-[2-hydroxy-4-(2-acryloyloxyethoxy)]-1,3,5-triazine, methacrylates of the foregoing acrylates and acrylates of the foregoing methacrylates. Combinations of these first monomers may be used to prepare the copolymer. In some embodiments, the first monomer includes a triazine, a benzophenone, or a benzotriazole group. In these embodiments, the first monomer can be any of the monomers including a triazine, benzophenone, or benzotriazole group listed above. In some embodiments, the first monomer includes a triazine group. In these embodiments, the first monomer can be any of the monomers including a triazine group listed above.

Many of these first monomers can be obtained commercially from a variety of chemical suppliers. Others can be prepared by treating a UVA having an available hydroxyl group (e.g., other than a phenolic hydroxyl group ortho to a triazine, benzoyl, or benzotriazole group) with (meth)acrylic acid or an equivalent thereof using conventional esterification methods. The term (meth)acrylic refers to both acrylic and methacrylic. In the case of a UVA having an available phenol group (e.g., other than a phenolic hydroxyl group ortho to a triazine, benzoyl, or benzotriazole group), the phenol group may be treated with ethylene carbonate or ethylene oxide to form a hydroxyethyl group that can then be treated with (meth)acrylic acid or an equivalent thereof using conventional esterification methods.

The components that are useful for preparing the fluorinated polymers disclosed herein include a second monomer, typically a fluorinated free-radically polymerizable monomer independently represented by formula Rf-Q-$(C_mH_{2m})$—O—C(O)—C($R^1$)=$CH_2$, Rf—$SO_2$—N($R^3$)—$(C_mH_{2m'})$—O—C(O)—C($R^1$)=$CH_2$, or Rf—CO—N($R^4$)—$(C_mH_{2m'})$—O—C(O)—C($R^1$)=$CH_2$, wherein Rf, $R^3$, $R^4$, $R^1$, m, and m' are as defined above.

Some compounds of Formula Rf-Q-$(C_mH_{2m})$—O—C(O)—C($R^1$)=$CH_2$, are available, for example, from commercial sources (e.g., 3,3,4,4,5,5,6,6,6-nonafluorohexyl acrylate from Daikin Chemical Sales, Osaka, Japan; 3,3,4,4,5,5,6,6,6-nonafluorohexyl 2-methylacrylate from Indofine Chemical Co., Hillsborough, N.J.; 1H,1H,2H,2H-perfluorooctylacrylate from ABCR, Karlsruhe, Germany; and 2,2,3,3,4,4,5,5-octafluoropentyl acrylate and methacrylate and 3,3,4,4,5,6,6,6-octafluoro-5-(trifluoromethyl)hexyl methacrylate from Sigma-Aldrich, St. Louis, Mo.). Others can be made by known methods (see, e.g., EP1311637 B1, published Apr. 5, 2006, for the preparation of 2,2,3,3,4,4,4-heptafluorobutyl 2-methylacrylate). Compounds wherein Q is —$SO_2N(R)$— can be made according to methods described in, e.g., U.S. Pat. Nos. 2,803,615 (Albrecht et al.) and U.S. Pat. No. 6,664,354 (Savu et al.), the disclosures of which, relating to free-radically polymerizable monomers and methods of their preparation, are incorporated herein by reference. A perfluoropolyether monomer of formula Rf—(CO)NHCH$_2$CH$_2$O(CO)C($R^1$)=CH$_2$ can be prepared by first reacting Rf—C(O)—OCH$_3$, for example, with ethanolamine to prepare alcohol-terminated Rf—(CO)NHCH$_2$CH$_2$OH, which can then be reacted with (meth)acrylic acid, (meth)acrylic anhydride, or (meth)acryloyl chloride to prepare the compound of Formula Rf—(CO)NHCH$_2$CH$_2$O(CO)C($R^1$)=CH$_2$, wherein $R^1$ is methyl or hydrogen, respectively. Other amino alcohols (e.g., amino alcohols of formula NRHXOH) can be used in this reaction sequence. In further examples, an ester of formula Rf—C(O)—OCH$_3$ or a carboxylic acid of formula Rf—C(O)—OH can be reduced using conventional methods (e.g., hydride, for example sodium borohydride, reduction) to an alcohol of formula Rf—CH$_2$OH. The alcohol of formula Rf—CH$_2$OH can then be reacted with methacryloyl chloride, for example, to provide a perfluoropolyether monomer of formula Rf—CH$_2$O(CO)C($R^1$)=CH$_2$. Examples of suitable reactions and reagents are further disclosed, for example, in the European patent EP 870 778 A1, published Oct. 14, 1998, and U.S. Pat. No. 3,553,179 (Bartlett et al.).

In some embodiments, copolymers according to the present disclosure further comprise at least one (e.g., at least 2, 3, 4, 5, 6, 7, 8, 9, 10, 15, or at least 20 up 30, 35, 40, 45, 50, 100, or up to 200) third divalent unit independently represented by formula:

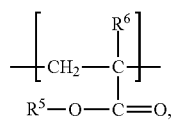

wherein each $R^6$ is independently hydrogen or methyl (in some embodiments, hydrogen, in some embodiments, methyl), and wherein each $R^5$ is independently alkyl having from 1 to 4 carbon atoms (in some embodiments, methyl, ethyl, n-propyl, isopropyl, n-butyl, iso-butyl, or tert-butyl).

In some embodiments, each $R^5$ is independently methyl or ethyl. In some embodiments, each $R^5$ is methyl. In some of these embodiments, the copolymer is prepared by including at least one compound represented by formula $R^5$—O—C(O)—C($R^6$)=CH$_2$ (e.g., methyl methacrylate, ethyl acrylate, propyl acrylate, butyl acrylate) in the components to be polymerized.

In some embodiments, the copolymer according to present disclosure is represented by formula:

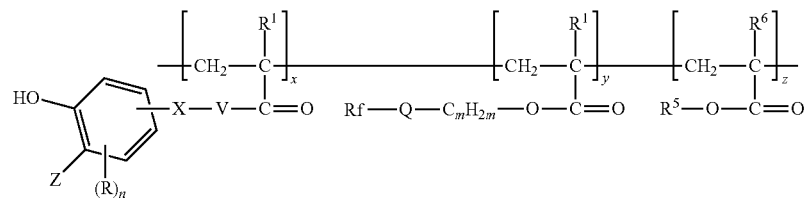

wherein Z, R, n, X, V, $R^1$, Rf, Q, m, $R^5$, and $R^6$ are as defined above in any of their embodiments, x and y are in a range from 1 to 200, and z is in a range from 0 to 200. However, it should be understood that the representation of the order of the divalent units is for convenience only and not meant to specify that the copolymer is a block copolymer. Random copolymers having first, second, and optionally third divalent units are also included in the representation.

The polymerization reaction for making the copolymers according to the present disclosure can be carried out in the presence of an added free-radical initiator. Free radical initiators such as those widely known and used in the art may be used to initiate polymerization of the components. Examples of suitable free-radical initiators include azo compounds (e.g., 2,2'-azobisisobutyronitrile (AIBN), 2,2'-azobis(2-methylbutyronitrile), or azo-2-cyanovaleric acid), hydroperoxides (e.g., cumene, tert-butyl or tert-amyl hydroperoxide), dialkyl peroxides (e.g., di-tert-butyl or dicumylperoxide), peroxyesters (e.g., tert-butyl perbenzoate or di-tert-butyl peroxyphthalate), and diacylperoxides (e.g., benzoyl peroxide or lauryl peroxide).

The free-radical initiator may also be a photoinitiator. Examples of useful photoinitiators include benzoin ethers (e.g., benzoin methyl ether or benzoin butyl ether); acetophenone derivatives (e.g., 2,2-dimethoxy-2-phenylacetophenone or 2,2-diethoxyacetophenone); 1-hydroxycyclohexyl phenyl ketone; and acylphosphine oxide derivatives and acylphosphonate derivatives (e.g., bis(2,4,6-trimethylbenzoyl)phenylphosphine oxide, diphenyl-2,4,6-trimethylbenzoylphosphine oxide, isopropoxyphenyl-2,4,6-trimethylbenzoylphosphine oxide, or dimethyl pivaloylphosphonate). Many photoinitiators are available, for examples, from BASF under the trade designation "IRGACURE". The photoinitiator may be selected so that the wavelength of light required to initiate polymerization is not absorbed by the ultraviolet absorbing group.

In some embodiments, the polymerization reaction is carried out in solvent. The components may be present in the reaction medium at any suitable concentration, (e.g., from about 5 percent to about 80 percent by weight based on the total weight of the reaction mixture). Illustrative examples of suitable solvents include aliphatic and alicyclic hydrocarbons (e.g., hexane, heptane, cyclohexane), aromatic solvents (e.g., benzene, toluene, xylene), ethers (e.g., diethyl ether, glyme, diglyme, and diisopropyl ether), esters (e.g., ethyl acetate and butyl acetate), alcohols (e.g., ethanol and isopropyl alcohol), ketones (e.g., acetone, methyl ethyl ketone and methyl isobutyl ketone), halogenated solvents (e.g., methylchloroform, 1,1,2-trichloro-1,2,2-trifluoroethane, trichloroethylene, trifluorotoluene, and hydrofluoroethers available, for example, from 3M Company, St. Paul, Minn. under the trade designations "HFE-7100" and "HFE-7200"), and mixtures thereof.

Polymerization can be carried out at any temperature suitable for conducting an organic free-radical reaction. Temperature and solvent for a particular use can be selected by those skilled in the art based on considerations such as the solubility of reagents, temperature required for the use of a particular initiator, and desired molecular weight. While it is not practical to enumerate a particular temperature suitable for all initiators and all solvents, generally suitable temperatures are in a range from about 30° C. to about 200° C. (in some embodiments, from about 40° C. to about 100° C., or from about 50° C. to about 80° C.).

Free-radical polymerizations may be carried out in the presence of chain transfer agents. Typical chain transfer agents that may be used in the preparation compositions according to the present invention include hydroxyl-substituted mercaptans (e.g., 2-mercaptoethanol, 3-mercapto-2-butanol, 3-mercapto-2-propanol, 3-mercapto-1-propanol, and 3-mercapto-1,2-propanediol (i.e., thioglycerol)); poly(ethylene glycol)-substituted mercaptans; carboxy-substituted mercaptans (e.g., mercaptopropionic acid or mercaptoacetic acid): amino-substituted mercaptans (e.g., 2-mercaptoethylamine); difunctional mercaptans (e.g., di(2-mercaptoethyl)sulfide); and aliphatic mercaptans (e.g., octylmercaptan, dodecylmercaptan, and octadecylmercaptan).

Adjusting, for example, the concentration and activity of the initiator, the concentration of each of the reactive monomers, the temperature, the concentration of the chain transfer agent, and the solvent using techniques known in the art can control the molecular weight of the copolymer.

The weight ratio of the first divalent units, second divalent units, and third divalent units, if present, in the copolymer disclosed herein may vary. For example, the first divalent units may be present in the copolymer in a range from 5 to 50 (in some embodiments, 10 to 40 or 10 to 30) percent, based on the total weight of the copolymer. The second divalent units may be present in a range from 5 to 95 percent, based on the total weight of the copolymer. In some embodiments, the second divalent unit is present in the copolymer in an amount of up to 50, 40, 30, 25, 20, or 10 percent by weight, based on the total weight of the copolymer. When the second divalent unit is present in an amount of at least 50, 60, 75, or 80 percent, it may be useful to use the copolymer in combination with a second copolymer having a lower weight percentage of second divalent units when making a composition according to the present disclosure as described below. When present, third divalent units may be present in a range from 5 to 90, 20 to 90, 50 to 90, or 50 to 80 percent by weight, based on the total weight of the copolymer.

Compositions according to the present disclosure include a fluoropolymer and a copolymer according to any of the aforementioned embodiments. The fluoropolymer is typically a fluorinated thermoplastic obtained by polymerizing one or more types of fully fluorinated or partially fluorinated monomers (e.g., tetrafluoroethylene, vinyl fluoride, vinylidene fluoride, hexafluoropropylene, pentafluoropropylene, trifluoroethylene, trifluorochloroethylene, and combinations of these in any useful ratio.) Fluoropolymers useful for practicing the present disclosure typically have at least some degree of crystallinity. In some embodiments, fluoropolymers useful for practicing the present disclosure have weight average molecular weights in a range from 30,000 grams per mole to 200,000 grams per mole. In some embodiments, the weight average molecular weight is at least 40,000 or 50,000 grams per mole up to 100,000, 150,000, 160,000, 170,000, 180,000, or up to 190,000 grams per mole. Useful fluoropolymers include ethylene-tetrafluoroethylene copolymers (ETFE), tetrafluoroethylene-hexafluoropropylene copolymers (FEP), tetrafluoroethylene-hexafluoropropylene-vinylidene fluoride copolymers (THV), polyvinylidene fluoride (PVDF), blends thereof, and blends of these and other fluoropolymers. Another useful fluoropolymer is a PDVF and hexafluoropropylene (HFP) blend in a variety of useful rations (e.g., in a range from 50:50 to 95:5 PVDF:HFP, such as 90:10). In some embodiments, the compositions according to the present disclosure include the fluoropolymer in an amount of at least 50, 60, 70, 80, 85, 90, 95, or 96 percent by weight based on the total weight of the composition. In some embodiments, the compositions according to the present disclosure include the fluoropolymer in an amount greater than 95 percent by weight, based on the total weight of the composition. In some embodiments, the compositions according to the present disclosure include the fluoropolymer in an amount of up to 99.5, 99, or 98 percent by weight based on the total weight of the composition.

The composition comprising the fluoropolymer and the copolymer described above can also include non-fluorinated materials. For example, the composition can include poly(methyl methacrylate) (PMMA) polymer or a copolymer of methyl methacrylate and a $C_2$-$C_8$ alkyl acrylate or methacrylate. The PMMA polymer or copolymer can have a weight average molecular weight of at least 50,000 grams per mole, 75,000 grams per mole, 100,000 grams per mole, 120,000 grams per mole, 125,000 grams per mole, 150,000 grams per mole, 165,000 grams per mole, or 180,000 grams per mole. The PMMA polymer or copolymer may have a weight average molecular weight of up to 500,000 grams per mole, in some embodiments, up to 400,000 grams per mole, and in some embodiments, up to 250,000 grams per mole. In some embodiments, a blend of polyvinylidene fluoride and poly(methyl methacrylate) can be useful.

In some embodiments, the composition according to the present disclosure includes a second copolymer comprising at least one (e.g., at least 2, 3, 4, 5, 6, 7, 8, 9, 10, 15, or at least 20 up to 30, 35, 40, 45, 50, 100, or up to 200) third divalent units and at least one (e.g., at least 2, 3, 4, 5, 6, 7, 8, 9, 10, 15, or at least 20 up to 30, 35, 40, 45, 50, 100, or up to 200) first divalent units. The first and third divalent units may be as described in any of the embodiments described above for the first and third divalent units in connection with the copolymer according to the present disclosure. The second copolymer may be, for example, a copolymer of an acrylate- or methacrylate-functional ultraviolet absorbing group and methyl methyacrylate. As described in the Examples, below, if a copolymer including a high weight percentage of the second divalent units results in some non-uniformity in color, haze, or continuity in a film made from the composition, including the second copolymer in the composition can unexpectedly provide a film having uniform color, haze, and caliper.

The composition according to the present disclosure typically includes a blend of the fluoropolymer, the copolymer, and any non-fluorinated polymers or second copolymers including the first divalent units. By "blend" it is meant that the fluoropolymer and the copolymer according to the present disclosure are not located in separate, distinguishable domains. In other words, the copolymer is typically dispersed throughout the composition; it is not isolated as if in a core-shell polymer particle. In many embodiments, the components of the composition are surprisingly compatible, and the composition appears homogeneous when the components are blended together.

The advantageous compatibility of the copolymer according to the present disclosure and the fluoropolymer in the compositions disclosed herein allows the compositions to be compounded without organic solvent. For example, the copolymer and the fluoropolymer can be melt-processed, compounded, mixed, or milled on conventional equipment. Conveniently, uniform masterbatch compositions can be made that include the copolymer according to the present disclosure at relatively high concentrations in the fluoropolymer. The masterbatch compositions can be extruded (e.g., in a single- or twin-screw extruder) and formed into films. After extrusion, the compositions can also be pelletized or granulated. The masterbatch compositions can then be extrusion compounded with additional fluoropolymer or non-fluorinated polymer (e.g., PMMA) and formed into films.

Other stabilizers may be added to the compositions according to the present disclosure to improve resistance to UV light. Examples of these include hindered amine light stabilizers (HALS) and anti-oxidants. HALS are typically compounds that can scavenge free-radicals, which can result from photodegradation. Some suitable HALS include a tetramethylpiperidine group, in which the nitrogen atoms on the piperidine may be unsubstituted or substituted by alkyl or acyl. Suitable HALS include decanedioic acid, bis(2,2,6,6-tetramethyl-1-(octyloxy)-4-piperidinyl)ester, bis(2,2,6,6-tetramethyl-4-piperidyl)sebacate, 8-acetyl-3-dodecyl-7,7,9,9-tetramethyl-1,3,8-triazaspiro(4,5)-decane-2,5-dione, bis (2,2,6,6-tetramethyl-4-hydroxypiperidine succinate), and bis(N-methyl-2,2,6,6-tetramethyl-4-piperidyl)secacate. Suitable HALS include those available, for example, from BASF, Florham Park, N.J., under the trade designations "CHIMASSORB". Exemplary anti-oxidants include those obtained under the trade designations "IRGAFOS 126", "IRGANOX 1010" and "ULTRANOX 626", also available from BASF. These stabilizers, if present, can be included in the compositions according to the present disclosure in any effective amount, typically up to 5, 2, to 1 percent by weight based on the total weight of the composition and typically at least 0.1, 0.2, or 0.3 percent by weight. Calcite may also be a useful additive in some compositions, for example, to protect against corrosion of processing equipment not made of corrosion resistant steel.

In some embodiments of the composition according to the present disclosure, the composition can be included in one or more layers of a multilayer film. The multilayer film is any film having more than one layer, typically in the thickness direction of the film. For example, the multilayer film may have at least two or three layers up to 10, 15, or 20 layers. In some embodiments, the composition may be included in a mirror film, which may have a layer (or layers) of the composition according to the present disclosure and a metal layer. In some embodiments, the composition can be included in a multilayer optical film (that is, having an optical layer stack), for example, such as those described in U.S. Pat. App. Pub. Nos. 2009/0283144 (Hebrink et al.) and 2012/0011850 (Hebrink et al.). Multi-layer optical films may have, for example, at least 100, 250, 500, or even at least 1000 optical layers. Such multi-layer optical films can be useful as ultraviolet light-reflective mirrors, visible light-reflective mirrors, infrared light-reflective mirrors, or any combination of these (e.g., broadband reflective mirrors). In some of these embodiments, the multilayer optical film reflects at least a major portion of the average light across the range of wavelengths that corresponds with the absorption bandwidth of a selected photovoltaic cell and does not reflect a major portion of the light that is outside the absorption bandwidth of the photovoltaic cell. In other embodiments, the multilayer optical film may be combined with a metal layer to provide a broadband reflector. In some embodiments, the composition according to the present disclosure may be useful, for example, as a retroreflective sheet.

In view of the advantageous compatibility of the copolymer according to the present disclosure and the fluoropolymer in the compositions disclosed herein, the present disclosure provides a method of making a composition and a method of making a film. The method of making a composition includes blending the copolymer according to the present disclosure with a fluoropolymer to make the composition. The method of making a film includes providing a composition according to the present disclosure, which includes at least the fluoropolymer and the copolymer, and extruding the composition into a film. The method may also include blending the composition with additional fluoropolymer or non-fluorinated polymer (e.g., if the composition is a masterbatch composition) before extruding the composition into a film.

In some embodiments of the composition or methods of making the composition or the film, the composition is essentially free of volatile organic solvent. Volatile organic solvents are typically those have a boiling point of up to 150° C. at atmospheric pressure. Examples of these include esters, ketones, and toluene. "Essentially free of volatile organic solvent" can mean that volatile organic solvent may be present (e.g., from a previous synthetic step or in a commercially available monomer) in an amount of up to 2.5 (in some embodiments, up to 2, 1, 0.5, 0.1, 0.05, or 0.01) percent by weight, based on the total weight of the composition. Advantageously, compositions disclosed herein and their films can be made without the expensive manufacturing step of removing organic solvent.

The composition according to the present disclosure can include the copolymer according to the present disclosure in a range of useful amounts. For example, the copolymer may be present in the composition at up to about 20 percent by weight, based on the total weight of the composition. In some embodiments, the copolymer and the second copolymer are present in the composition in an amount up to 20 percent combined weight, based on the total weight of the composition. For a masterbatch, useful amounts of the copolymer or the copolymer combined with the second polymer may be in a range from 2 to 20, 3 to 15, or 4 to 10 percent by weight, based on the total weight of the composition. For a final film article, for example, useful amounts of the copolymer or the copolymer combined with the second polymer may be in a range from 0.5 to 10, 0.5 to 5, or 1 to 5 percent by weight, based on the total weight of the composition. As shown in the Examples, below, compositions with ultraviolet light-absorbing oligomers in this range are quite effective at absorbing ultraviolet light, and the ultraviolet light protection is maintained even after weathering or exposure to heat and humidity. This is unexpected in view of JP2001/19895, published Jan. 23, 2001, which suggests that polymeric ultraviolet light absorbers are most useful in compositions at 30 to 60 parts per hundred.

The advantageous compatibility of the copolymer according to the present disclosure and the fluoropolymer in the compositions disclosed herein, which allows the compositions to be extrusion compounded, for example, is not found in other many compositions including UVAs and fluoropolymers.

For example, while a compound represented by formula

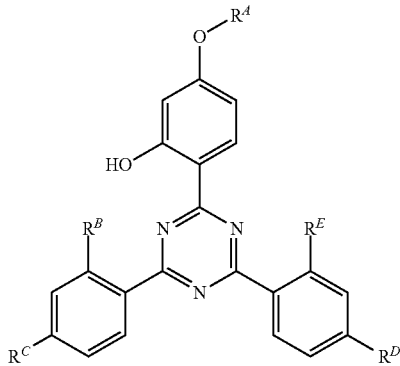

Wherein $R^A$ is $C_{1-20}$ alkyl or aryl and $R^B$, $R^C$, $R^D$, and $R^E$ are hydrogen, $C_{1-5}$ alkyl, hydroxyl, or aryl are said to be useful UVAs in polymer blends (see, e.g., JP2001/001478, published, Jan. 9, 2001), Comparative Examples 1 and 2, below, show that 2-(4,6-diphenyl-1,3,5-triazin-2-yl-)-5-((hexyl)oxyphenol and 2-[4-[(2-hydroxy-3-(2'-ethyl)hexyl)oxy]-2-hydroxyphenyl]-4,6-bis(2,4-dimethylphenyl)-1,3,5-triazine when mixed with PVDF provided more haze, less clarity, and less visible and infrared light transmission than the copolymers according to the present disclosure. Also, when a triazine UV absorber obtained from BASF, Florham Park, N.J., under the trade designation "TINUVIN 1600" was extrusion compounded with PVDF, the resulting strands were very hazy and difficult to pelletize.

Furthermore, while incorporating acryloyl or methacryloyl functional 2-hydroxybenzophenones or 2-hydroxyphenyl-2H-benzotriazoles into high molecular weight PMMA has been proposed, low weathering resistance was observed in comparison to non-covalently attached UVAs (see, U.S. Pat. Appl. Pub. No. 2010/0189983 (Numrich et al.). In contrast, the copolymers according to the present disclosure have excellent resistance to weathering, as demonstrated by high retention of percent transmission of visible light and low transmission of ultraviolet light after weathering according to the method described in the Examples, below.

In some embodiments, compositions according to the present disclosure are transmissive to both visible and infrared light. The term "transmissive to visible and infrared light" as used herein can mean having an average transmission over the visible and infrared portion of the spectrum of at least about 75% (in some embodiments at least about 80, 85, or 90, 92, 95, 97, or 98%) measured along the normal axis. In some embodiments, the composition has an average transmission over a range of 400 nm to 1400 nm of at least about 75% (in some embodiments at least about 80, 85, 90, 92, 95, 97, or 98%).

Compositions according to the present disclosure may be useful for a variety of outdoor applications. For example, the compositions according to the present disclosure may be useful, for example, for top layers of traffic or other signs, automotive exteriors, roofing materials or other architectural films, or window films.

Compositions according to the present disclosure are useful, for example, for encapsulating solar devices. In some embodiments, the composition (e.g., in the form of a film) is disposed on, above, or around a photovoltaic cell. Accordingly, the present disclosure provides a photovoltaic device including the composition disclosed herein in which the composition (e.g., in the form of a film) is used as a top sheet for the photovoltaic device. Photovoltaic devices include photovoltaic cells that have been developed with a variety of materials each having a unique absorption spectrum that converts solar energy into electricity. Each type of semiconductor material has a characteristic band gap energy which causes it to absorb light most efficiently at certain wavelengths of light, or more precisely, to absorb electromagnetic radiation over a portion of the solar spectrum. The compositions according to the present disclosure typically do not interfere with absorption of visible and infrared light, for example, by photovoltaic cells. In some embodiments, the composition has an average transmission over a range wavelengths of light that are useful to a photovoltaic cell of at least about 75% (in some embodiments at least about 80, 85, 90, 92, 95, 97, or 98%). Examples of materials used to make solar cells and their solar light absorption band-edge wavelengths include: crystalline silicon single junction (about 400 nm to about 1150 nm), amorphous silicon single junction (about 300 nm to about 720 nm), ribbon silicon (about 350 nm to about 1150 nm), CIS (Copper Indium Selenide) (about 400 nm to about 1300 nm), CIGS (Copper Indium Gallium di-Selenide) (about 350 nm to about 1100 nm), CdTe (about 400 nm to about 895 nm), GaAs multi-junction (about 350 nm to about 1750 nm). The shorter wavelength left absorption band edge of these semiconductor materials is typically between 300 nm and 400 nm. Organic photovoltaic cells may also be useful. One skilled in the art understands that new materials are being developed for more efficient solar cells having their own unique longer wavelength absorption band-edge. In some embodiments, the photovoltaic device including the composition according to the present disclosure includes a CIGS cell. In some embodiments, the photovoltaic device to which the assembly is applied comprises a flexible film substrate.

A composition according to the present disclosure (e.g., in the form of a film) can be used as a substrate for a barrier stack (see, e.g., U.S. Pat. Appl. Pub. No. 2012/0227809 (Bharti et al.) or can be attached to a barrier stack using an optically clear adhesive such as a pressure sensitive adhesive (PSA) (see, e.g., U.S. Pat. Appl. Pub. No. 2012/0003451 (Weigel et al.). Examples of PSAs include acrylates, silicones, polyisobutylenes, ureas, and combinations thereof Some useful commercially available PSAs include UV curable PSAs such as those available from Adhesive Research, Inc., Glen Rock, Pa., under the trade designations "ARclear 90453" and "ARclear 90537" and acrylic optically clear PSAs available, for example, from 3M Company, St. Paul, Minn., under the trade designations "OPTICALLY CLEAR LAMINATING ADHESIVE 8171", "OPTICALLY CLEAR LAMINATING ADHESIVE 8172", and "OPTICALLY CLEAR LAMINATING ADHESIVE 8172P". In some embodiments, the top sheet and barrier film assembly is attached to the photovoltaic cell with an encapsulant. Although other encapsulants may be useful, in some embodiments, the encapsulant is ethylene vinylacetate.

Some Embodiments of the Disclosure

In a first embodiment, the present disclosure provides a copolymer comprising: a first divalent unit comprising a pendent ultraviolet absorbing group; and a second divalent unit represented by formula:

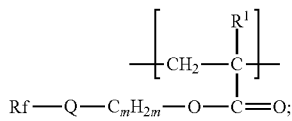

wherein
Rf represents a fluoroalkyl group having from 1 to 6 carbon atoms optionally interrupted by one —O— group, or Rf represents a polyfluoropolyether group;
$R^1$ is hydrogen or methyl;
Q is a bond, —$SO_2$—N(R)—, or —C(O)—N(R)—, wherein R is alkyl having from 1 to 4 carbon atoms or hydrogen; and
m is an integer from 0 to 11,
wherein the copolymer is a thermoplastic copolymer.

In a second embodiment, the present disclosure provides the copolymer of the first embodiment, wherein the pendent ultraviolet absorbing group comprises a triazine, a benzophenone, or a benzotriazole.

In a third embodiment, the present disclosure provides the copolymer of the first or second embodiment, wherein the first divalent unit is represented by formula:

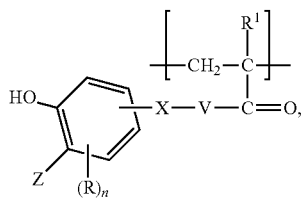

wherein
$R^1$ is hydrogen or methyl;
V is O or NH;
X is alkylene or alkyleneoxy group having from 1 to 10 carbon atoms and optionally interrupted by one or more —O— groups and optionally substituted by a hydroxyl group;
R is alkyl having from one to four carbon atoms;
n is 0 or 1; and
Z is a benzoyl group, a 4,6-bisphenyl[1,3,5]triazin-2-yl group, or a 2H-benzotriazol-2-yl group, wherein the benzoyl group, 4,6-bisphenyl[1,3,5]triazin-2yl group, and 2H-benzotriazol2-yl group are optionally substituted by one or more alkyl, aryl, alkoxy, hydroxyl, or halogen substituents, or a combination of these substituents.

In a fourth embodiment, the present disclosure provides the copolymer of any one of the first to third embodiments, wherein the pendent ultraviolet absorbing group comprises a triazine.

In a fifth embodiment, the present disclosure provides the copolymer of any one of the first to fourth embodiments, wherein Rf represents a perfluoroalkyl group having up to 4 carbon atoms.

In a sixth embodiment, the present disclosure provides the copolymer of any one of the first to fifth embodiments, further comprising a third divalent unit represented by formula:

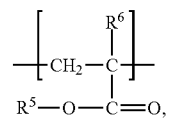

wherein $R^6$ is hydrogen or methyl; and $R^5$ is alkyl having from 1 to 4 carbon atoms.

In a seventh embodiment, the present disclosure provides the copolymer any one of the first to sixth embodiments, wherein the second divalent unit is present in the copolymer in an amount of up to 50 percent by weight, based on the total weight of the copolymer.

In an eighth embodiment, the present disclosure provides the copolymer of any one of the first to seventh embodiments, wherein the copolymer is an oligomer with a number average molecular weight of up to 50,000 grams per mole.

In a ninth embodiment, the present disclosure provides the copolymer of the eighth embodiment, wherein the oligomer has a number average molecular weight greater than 5000 grams per mole.

In a tenth embodiment, the present disclosure provides the copolymer of the eighth or ninth embodiment, wherein the oligomer has a number average molecular weight of less than 20000 grams per mole.

In an eleventh embodiment, the present disclosure provides a composition comprising a fluoropolymer and the copolymer of any one of the first to tenth embodiments.

In a twelfth embodiment, the present disclosure provides the composition of the eleventh embodiment, further comprising poly(methyl methacrylate).

In a thirteenth embodiment, the present disclosure provides the composition of the eleventh or twelfth embodiment, wherein the fluoropolymer is present in the composition in an amount of at least 50 percent by weight, based on the total weight of the composition.

In a fourteenth embodiment, the present disclosure provides the composition of any one of the eleventh to thirteenth embodiments, wherein the copolymer is present in the composition in an amount up to 10 percent by weight, based on the total weight of the composition. In some of these embodiments, the copolymer is present in the composition in an amount ranging from 0.5 percent to 5 percent by weight, based on the total weight of the composition.

In a fifteenth embodiment, the present disclosure provides the composition of any one of the eleventh to fourteenth embodiments, further comprising a second copolymer comprising the first divalent unit and at least one of the second or third divalent units.

In a sixteenth embodiment, the present disclosure provides the composition of the fifteenth embodiment, wherein the second copolymer is a copolymer of methyl methacrylate and an acrylate- or methacrylate-functional ultraviolet absorbing group.

In a seventeenth embodiment, the present disclosure provides the composition of the fifteenth or sixteenth embodiment, wherein the copolymer and the second copolymer are present in the composition in an amount up to 10 percent combined weight, based on the total weight of the composition.

In an eighteenth embodiment, the present disclosure provides the composition of any one of the eleventh to seventeenth embodiments, wherein the composition is essentially free of volatile organic solvent.

In a nineteenth embodiment, the present disclosure provides the composition of any one of the eleventh to eighteenth embodiments, wherein the fluoropolymer is selected from the group consisting of ethylene-tetrafluoroethylene copolymer, a tetrafluoroethylene-hexafluoropropylene copolymer, a tetrafluoroethylene-hexafluoropropylene-vinylidene fluoride copolymer, or polyvinylidene fluoride.

In a twentieth embodiment, the present disclosure provides the composition of any one of the eleventh to nineteenth embodiments, wherein the composition is in the form of a film.

In a twenty-first embodiment, the present disclosure provides the composition of the twentieth embodiment, wherein the film is a multilayer film.

In a twenty-second embodiment, the present disclosure provides the composition of the twenty-first embodiment, wherein the film is a multilayer optical film.

In a twenty-third embodiment, the present disclosure provides a photovoltaic device comprising the composition of any one of the eleventh to twenty-second embodiments.

In a twenty-fourth embodiment, the present disclosure provides a method of making a film, the method comprising providing the composition of any one of the eleventh to twenty-second embodiments and extruding the composition into the film.

In a twenty-fifth embodiment, the present disclosure provides a method of making a composition, the method comprising blending the copolymer of any one of the first to tenth embodiments with a fluoropolymer to make the composition.

Embodiments of the methods disclosed herein are further illustrated by the following examples, but the particular materials and amounts thereof recited in these examples, as well as other conditions and details, should not be construed to unduly limit this invention.

EXAMPLES

Preparative Example 1

2-{4-[4,6-Bis-(2,4-dimethyl-phenyl)-[1,3,5]triazin-2-yl]-3-hydroxy-phenoxy}-ethyl acrylate ester

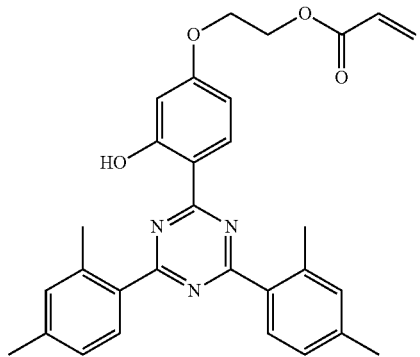 [SMILES: C=CC(=O)OCCOc1ccc(-c2nc(-c3ccc(C)cc3C)nc(-c3ccc(C)cc3C)n2)c(O)c1]

Part A

A three liter 3-neck round bottom flask was equipped with a temperature probe, condenser and mechanical stirrer. The flask was charged with 500 grams (1.26 moles) of 2,4-di-(2,4-dimethylphenyl)-6-(2,4-dihydroxyphenyl)-triazine, 124 grams (1.4 moles) of ethylene carbonate, 18 grams (0.085 moles) tetraethylammonium bromide and 475 grams of dimethyl formamide. The batch was heated to 150° C. and maintained at that temperature for five hours. The evolution of $CO_2$ from the batch was observed. After five hours, 15 grams additional ethylene carbonate and 2 grams additional tetraethylammonium bromide were added. The batch was heated at 150° C. for three hours, and then 15 grams additional ethylene carbonate and 2 grams additional tetraethylammonium bromide were added. The batch was heated at 150° C. for three more hours, after which time no more starting material was observed by thin layer chromatography.

The batch was allowed to cool to 80° C., and 1360 grams of isopropanol (IPA) was added with good agitation. The mixture was cooled to room temperature, and the solid product was collected by filtration onto a Buchner funnel The solid product was taken up into 1000 grams each of water and IPA, stirred well, and collected by filtration onto a Buchner funnel The product was air-dried to give 540 grams (96%) of an off-white solid product, 2-[4,6-bis-(2,4-dimethylphenyl)-[1,3,5]triazin-2-yl]-5-(2-hydroxyethoxy)phenol, mp=172° C.-173° C. The product was used without further purification.

Part B

A two liter 3-neck round bottom flask was equipped with a temperature probe, Dean-Stark trap with condenser, and mechanical stirrer. The flask was charged with 170 grams (0.385 moles) of 2-[4,6-bis-(2,4-dimethylphenyl)-[1,3,5]triazin-2-yl]-5-(2-hydroxyethoxy)phenol, prepared in Part A, 780 grams of toluene, 0.24 grams of 4-methoxyphenol (MEHQ) inhibitor, 0.38 grams of phenothiazine inhibitor, 8.5 grams of p-toluene sulfonic acid, and 30.5 grams (0.42 moles) of acrylic acid. The batch was heated with medium agitation at reflux (about 115° C.) for six hours, and the azeotroped water can collected in the Dean-Stark trap. After five hours, five grams additional acrylic acid was added, and the batch was heated for three more hours. Analysis by thin layer chromatography showed the batch had no residual starting material.

The batch was allowed to cool to 80° C., and a pre-mix of 25 grams sodium carbonate in 300 grams water was added. The reaction mixture was cooled to about 10° C. with an ice bath, and the precipitated product was collected by filtration on a Buchner funnel The solid was taken back up in a mixture of 800 grams water and 200 grams IPA, and the mixture was stirred well and filtered. The product was air-dried to give 182 grams (96%) of the off-white solid product, 2-{4-[4,6-bis-(2,4-dimethyl-phenyl)-[1,3,5]triazin-2-yl]-3-hydroxyphenoxy}ethyl acrylate ester, mp=126° C.-128° C.

Preparative Example 2

2-(4-Benzoyl-3-hydroxyphenoxy)ethyl acrylate ester

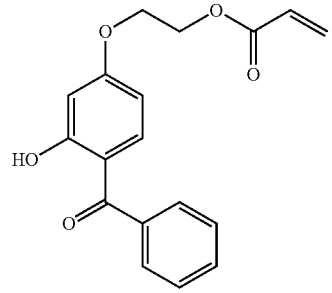 [SMILES: C=CC(=O)OCCOc1ccc(C(=O)c2ccccc2)c(O)c1]

Part A

A five liter 3-neck round bottom flask was equipped with a temperature probe, condenser, and mechanical stirrer. The flask was charged with 500 grams (2.33 moles) of 2,4-dihydroxybenzophenone, 216 grams (2.45 moles) of ethylene carbonate, and 25 grams (0.12 moles) tetraethylammonium bromide. The batch was heated to 140° C. and maintained at that temperature for twenty-four hours. The evolution of $CO_2$ from the batch was observed. Analysis by thin layer chromatography showed the batch had no residual starting material.

The batch was allowed to cool to 80° C., and 1200 grams of isopropanol was added with good agitation. The batch temperature was held at about 60° C., and 2500 grams of water was added while maintaining the batch temperature at about 60° C. The batch was cooled to room temperature with slow agitation, and the product was collected by filtration onto a Buchner funnel The solid product was taken back up into 1000 grams of water and 200 grams of IPA, stirred well, and collected by filtration onto a Buchner funnel The product was air-dried to give 545 grams (90%) of an off-white solid product, 2-hydroxy-4-(2-hydroxyethyl)benzophenone, mp=88° C.-89° C. The product was used without further purification.

Part B

A two liter 3-neck round bottom flask was equipped with a temperature probe, Dean-Stark trap with condenser, and mechanical stirrer. The flask was charged with 200 grams (0.77 moles) of 2-hydroxy-4-(2-hydroxyethyl)benzophenone, prepared in Part A, 850 grams toluene, 0.48 grams MEHQ inhibitor, 0.77 grams phenothiazine inhibitor, 17 grams p-toluene sulfonic acid, and 61.4 grams (0.85 moles) of acrylic acid. The batch was heated with medium agitation at reflux (about 115° C.) for six hours, and the azeotroped water was collected in the Dean-Stark trap. After five hours, five grams additional acrylic acid was added, and the batch was heated for three more hours. Analysis by thin layer chromatography showed the batch had no residual starting material.

The batch was cooled to 80° C., and a pre-mix of 25 grams sodium carbonate in 300 grams water was added. The batch was phase split, and the lower aqueous layer was removed. The organic layer was washed with a mixture of 25 grams sodium chloride in 300 grams water. The solvent was stripped using a rotary evaporator. The residual brown oil product was taken up in 230 grams of IPA, and heated to about 60° C. to make a solution. The mixture was agitated gently and cooled to −10° C. to crystallize the off-white solid product. The product was air-dried to give 217 grams (90%) of the off-white solid product, 2-(4-benzoyl-3-hydroxyphenoxy)ethyl acrylate ester, mp=126° C.-128° C.

Preparative Example 3

Heptafluorobutyl Methacrylate

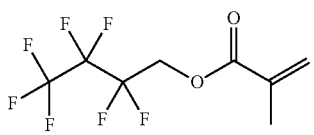 [SMILES: C=C(C)C(=O)OCC(F)(F)C(F)(F)C(F)(F)F]

Heptafluorobutanol (1890 grams, 9.45 moles), 30 grams of 95% sulfuric acid, 1.8 grams of phenothiazine, 1.5 grams of MEHQ were placed in a 3 liter flask that was fitted with an overhead stirrer, thermocouple, and a addition funnel The reaction was heated to 55° C., and at that time the addition of methacrylic anhydride (1527 grams, 9.91 moles) was begun. The batch exothermed to 65° C., and the addition was adjusted to keep the reaction temperature at 65° C. At this time the set point of the controller was raised to 65° C. The addition of methacrylic anhydride was completed in 2.5 hours. The reaction mixture was then heated at 65° C. for 3 hours and then allowed to cool to room temperature. Analysis by gas chromatography (GC) indicated the material to be 0.4% unreacted heptafluorobutanol, 0.9% heptafluorobutyl acetate, 63.6 desired heptafluorobutyl methacrylate, 30.6% methacrylic acid, and 0.4 unreacted methacrylic anhydride.

1800 grams of water was added, and the batch was stirred for 30 minutes. The pH was measured at less than 2; analysis by GC showed the material to be 1.0% heptafluorobutyl acetate, 70.9 desired heptafluorobutyl methacrylate, 22.9% methacrylic acid, and 1.4% unreacted methacrylic anhydride. The black water phase was split off from the translucent olive/brown fluorochemical phase; 3006 grams of fluorochemical phase was obtained.

Another 1800 grams of water was added to the fluorochemical phase, and the batch was stirred for 30 minutes. The pH was measured at less than 2; analysis by GC showed the material to be 1.1% heptafluorobutyl acetate, 74.7% desired heptafluorobutyl methacrylate, 19% methacrylic acid, and 1.4% unreacted methacrylic anhydride. The light green water phase was split off from the translucent green flluorochemical phase; 2840 grams of fluorochemical phase was obtained.

The batch was allowed to split, and the translucent amethyst fluorochemical bottom phase was split off and saved. The fluorochemical phase was then stirred for 30 minutes with a mixture of 285 grams of potassium hydroxide and 1800 grams of water. The bottom raspberry colored fluorochemical phase was split off to give 2537 grams of the crude product; analysis by GC showed the material to be 1.3% heptafluorobutyl acetate, 88.3% desired heptafluorobutyl methacrylate, 6.7% methacrylic acid, and 1.4 unreacted methacrylic anhydride.

For the next wash the batch was added to 85 g of potassium carbonate dissolved in 1800 g of water and stirred for 30 min with the previously washed FC product. GC showed the material to be 1.3% heptafluorobutyl acetate and 94.4% desired heptafluorobutyl methacrylate. Methacrylic acid and unreacted methacrylic anhydride were not detected. The pH of the water layer was measured at 10-11. The product weighed 2275 grams. This material was washed again with 1800 grams of water for 30-minutes. The pH of the water layer was measured at 7-8. A total of 2235 grams of the product was isolated after separation of the water layer.

The crude heptafluorobutyl methacrylate was added to a 3 liter flask fitted with a distillation head and a thermocouple. More inhibitor (3 grams of phenothiazine and 0.7 gram of MEHQ) were added to the distillation pot. The acrylate was distilled to give 156 of precut distilling at 142 mm Hg at a head temperature of 80° C.-86° C. (88% desired methacrylate). The desired material distilled at 86° C. -° C. at 131 mm Hg; a total of 1934 grams of heptafluorobutyl methacrylate were obtained.

Molecular Weight Determination

In the following copolymer examples, the molecular weight was determined by comparison to linear polystyrene polymer standards using gel permeation chromatography (GPC). The GPC measurements were carried out on a Waters Alliance 2695 system (obtained from Waters Corporation, Milford, Mass.) using four 300 millimeter (mm) by 7 8 mm linear columns of 5 micrometer styrene divinylbenzene copolymer particles (obtained from Polymer Laboratories, Shropshire, UK, under the trade designation "PLGEL") with pore sizes of 10,000, 1000, 500, and 100 angstroms. A refractive index detector from Waters Corporation (model 410) was used at 40° C. A 50-milligram (mg) sample of copolymer in ethyl acetate was diluted with 10 milliliters (mL) of tetrahydrofuran (inhibited with 250 ppm of BHT) and filtered through a 0.45 micrometer syringe filter. A sample volume of 100 microliters was injected onto the column, and the column temperature was 40° C. A flow rate of 1 mL/minute was used, and the mobile phase was tetrahydrofuran. Molecular weight calibration was performed using narrow dispersity polystyrene standards with peak average molecular weights ranging from $3.8 \times 10^5$ grams per mole to 580 grams per mole. Calibration and molecular weight distribution calculations were performed using suitable GPC software using a third order polynomial fit for the molecular weight calibration curve. Each reported result is an average of duplicate injections.

Glass Transition Temperature

For the following copolymer examples, the glass transition temperatures were measured by Differential Scanning Calorimetry (DSC) using a Q2000 Differential Scanning Calorimeter obtained from TA Instruments, New Castle, Del. Glass transition temperature was determined using Modulated DSC with a modulation amplitude of ±1° C. per minute and a ramp rate of 3° C. per minute.

Copolymer Example 1

Random Copolymer of 10% by Weight Preparative Example 3, 70% by Weight Methyl Methacrylate, and 20% by Weight Preparative Example 1

A five-liter flask was equipped with an overhead stirrer, a thermocouple, and a reflux condenser. With nitrogen flowing though the opening used for charging (from adapter at top of reflux condenser), 50 grams Preparative Example 3, 350 grams of methyl methacrylate (obtained from Alfa Aesar, Ward Hill, Mass.), 100 grams of Preparative Example 1, and 2500 grams of ethyl acetate were added. After charging, the batch was kept under sight positive nitrogen pressure in order to exclude oxygen from the batch. The set point on the controller for the thermocouple (obtained from J-Kem, St. Louis, Mo.) was raised to 70° C., and 14 grams of 2,2'-azobis(2-methylbutyronitrile) (obtained from E.I. du Pont de Nemours and Company, Wilmington, Del., under the trade designation "VAZO 67") were added. The batch was observed for 15 minutes. The set point was raised to 74° C., and the timer was set for 18 hours. The batch was allowed to come to room temperature. The batch had olive-colored solid floating in it and was filtered through grade 40 filter paper obtained from Whatman, Kent, UK, to give a clear yellow solution.

The solution was poured out into four aluminum trays and dried at room temperature overnight, then at 100° C. for 4 hours, and then one hour at 120° C. A total of 514 grams of solid was isolated. The trays were allowed to cool to room temperature to a hard material, which was processed into a powder.

The procedure was repeated five times. The molecular weight of the reaction mixture, before drying, was determined by gel permeation chromatography using the method described above. The results for the five runs are shown in Table 1, below.

TABLE 1

| Run | Mw | Mn | Mz | Mw/Mn |
|---|---|---|---|---|
| 1 | 1.376E+04 | 7.021E+03 | 2.027E+04 | 1.96 |
| 2 | 1.373E+04 | 7.012E+03 | 2.011E+04 | 1.96 |
| 3 | 1.407E+04 | 7.887E+03 | 2.043E+04 | 1.78 |
| 4 | 1.439E+04 | 8.051E+03 | 2.107E+04 | 1.79 |
| 5 | 1.494E+04 | 8.241E+03 | 2.182E+04 | 1.81 |

Copolymer Example 2

Random Copolymer of 80% by Weight Preparative Example 3 and 20% by Weight Preparative Example 1

Copolymer Example 2 was prepared using the method of Co-polymer Example 1 except using 400 grams Preparative Example 3, 100 grams of Preparative Example 1, and 14 grams of a 50/50 mixture of mineral spirits/tert-butyl peroxy-2-ethylhexanoate (obtained from Atofina, Philadelphia, Pa., under the trade designation "LUPEROX 26M50") instead of 2,2'-azobis(2-methylbutyronitrile). The glass transition temperature was measured using DSC using the method described above and found to be 38° C. The procedure was repeated five times. The molecular weight of the reaction mixture, before drying, was determined by gel permeation chromatography using the method described above. Two samples were analyzed for each run, and the results are shown in Table 2, below.

TABLE 2

| Sample | Mw (Daltons) | Mn (Daltons) | Mz (Daltons) | Mw/Mn |
| --- | --- | --- | --- | --- |
| Run 1-Sample 1 | 21930 | 12392 | 33153 | 1.77 |
| Run 1-Sample 2 | 21389 | 13593 | 31719 | 1.57 |
| Run 2-Sample 1 | 20364 | 12548 | 30056 | 1.62 |
| Run 2-Sample 2 | 20352 | 12681 | 29911 | 1.60 |
| Run 3-Sample 1 | 20950 | 13290 | 30616 | 1.58 |
| Run 3-Sample 2 | 21056 | 13083 | 31089 | 1.61 |
| Run 4-Sample 1 | 20286 | 12682 | 29802 | 1.60 |
| Run 4-Sample 2 | 20255 | 12668 | 29648 | 1.60 |
| Run 5-Sample 1 | 26914 | 16547 | 39830 | 1.63 |
| Run 5-Sample 2 | 26800 | 16681 | 39449 | 1.61 |

Copolymer Example 3

Random Copolymer of 80% by Weight Preparative Example 3 and 20% by Weight Preparative Example 2

Copolymer Example 3 was prepared using the method of Copolymer Example 2 except using 100 grams Preparative Example 2 instead of 100 grams of Preparative Example 1. The batch was clear at the end of the reaction, so no filtration was performed. Two glass transition temperatures was observed at 62.1° C. and 83° C. using DSC according to the method described above. The molecular weight of the reaction mixture was determined by GPC using the method described above. The analysis was done for five different runs as described in Copolymer Example 1, and the results are shown in Table 3, below.

TABLE 3

| Run | Mw (Daltons) | Mn (Daltons) | Mz (Daltons) | Mw/Mn |
| --- | --- | --- | --- | --- |
| 1 | 27199 | 16309 | 40430 | 1.67 |
| 2 | 26860 | 15966 | 40328 | 1.68 |
| 3 | 25926 | 15062 | 38899 | 1.72 |
| 4 | 27397 | 16493 | 40929 | 1.66 |
| 5 | 27266 | 16179 | 40859 | 1.69 |

Copolymer Example 4

Random Copolymer of 10% by Weight Preparative Example 3, 70% by Weight Methyl Methacrylate, and 20% by Weight 2-{2-Hydroxy-5-[2-(methacryloyloxy)ethyl]phenyl}-2H-benzotriazole Copolymer Example 4 was prepared using the method of Copolymer Example 1 except using 100 grams 2-{2-hydroxy-5-[2-(methacryloyloxy)ethyl]phenyl}-2H-benzotriazole (obtained from TCI America, Portand, Oreg.) instead of 100 grams of Preparative Example 1. The batch was clear at the end of the reaction, so no filtration was performed. A glass transition temperature was measured at 56.0° C. by DSC using the test method described above. Using the GPC method described above, the weight average molecular weight was found to be 20420 Daltons, the number average molecular weight was found to be 11880 Daltons, and the Z average molecular weight was found to be 31080 Daltons. A polydispersity of 1.73 was calculated. The GPC analysis was carried out on one sample.

Copolymer Example 5

Random Copolymer of 10% by Weight $C_3F_7O$ $(C_3F_6O)_{5.9}CFCF_2C(O)NHCH_2CH_2OC(O)C$ $(CH_3)=CH_2$, 70% by Weight Methyl Methacrylate, and 20% by Weight Preparative Example 1

Copolymer Example 5 was prepared using the method of Copolymer Example 1 except using 22 grams of $C_3F_7O$ $(C_3F_6O)_{5.9}CFCF_2C(O)NHCH_2CH_2OC(O)C(CH_3)=CH_2$ instead of Preparative Example 3, 154 grams of methyl methacrylate, 44 grams of Preparative Example 1, 1100 grams of ethyl acetate, and 6.1 grams of 2,2'-azobis(2-methylbutyronitrile). $C_3F_7O(C_3F_6O)_kCFCF_2C(O)$ $NHCH_2CH_2OC(O)CH=CH_2$ was prepared in two steps. First $C_3F_7O(C_3F_6O)_{5.9}CFCF_2C(O)NHCH_2CH_2OH$ with an average molecular weight of 1313 grams per mole was prepared as described in U.S. Pat. No. 6,923,921 (Flynn et al.) The methacrylate was prepared as in U S. Pat. No. 7,101,618 (Coggio et al.) Preparation Example 1 except that methacryloyl chloride was used instead of acryloyl chloride. The batch was clear at the end of the reaction, so no filtration was performed. The glass transition temperature was measured using DSC using the method described above and found to be 87.2° C. Using the GPC method described above, the weight average molecular weight was found to be 19910 Daltons, the number average molecular weight was found to be 12750 Daltons, and the Z average molecular weight was found to be 28700 Daltons. A polydispersity of 1.56 was calculated. The GPC analysis was carried out on one sample.

Copolymer 6

Random Copolymer of 80% by Weight Methyl Methacrylate and 20% Preparative Example 2

Copolymer Example 6 was prepared using the method of Copolymer Example 1 except using no Preparative Example 3, using 400 grams of methyl methacrylate, and using 100 grams of Preparative Example 2 instead of Preparation Example 1. The batch was clear at the end of the reaction, so no filtration was performed. The glass transition temperature was measured using DSC using the method described above and found to be 71.5° C. The molecular weight of the reaction mixture was determined by GPC using the method described above. The reaction was run three times, and 2 or 3 samples were analyzed from each run. The results are shown in Table 4, below.

TABLE 4

| Sample | Mw (Daltons) | Mn (Daltons) | Mz (Daltons) | Mw/Mn |
|---|---|---|---|---|
| Run 1-Sample 1 | 27756 | 18533 | 38428 | 1.50 |
| Run 1-Sample 2 | 26654 | 17737 | 36863 | 1.50 |
| Run 1-Sample 3 | 26573 | 17687 | 36828 | 1.50 |
| Run 2-Sample 1 | 26683 | 17681 | 37032 | 1.51 |
| Run 2-Sample 2 | 26685 | 17546 | 37068 | 1.52 |
| Run 3-Sample 1 | 27551 | 18376 | 38102 | 1.50 |
| Run 3-Sample 2 | 27423 | 18184 | 37962 | 1.51 |

Haze and Clarity Measurements

The haze and clarity of the film examples below were measured using a Haze-Gard Plus (BYK-Gardner USA, Columbia, Md.).

Accelerated Ultraviolet Light Exposure

Films were exposed in a weathering device according to a high-irradiance version of ASTM G155 Cycle 1 run at slightly higher temperature. Radiation from the xenon arc source was appropriately filtered so as to provide an excellent match to the ultraviolet portion of the solar spectrum. Samples were tested prior to any exposure to these accelerated weathering conditions, and then removed at total UV dosage intervals of about 373 MJ/m$^2$ for evaluation. The number of these dosage intervals to which the Examples were exposed are specified below.

Heat and Humidity Exposure (85/85)

For 85/85 evaluation, 4 in. (10 cm) by 6-in. (15 cm) samples were hung in a chamber at 85° F. and 85% relative humidity for 1000 hours. The samples were then removed from the chamber, maintained at ambient conditions for 24 hours, and then evaluated for haze, clarity, and transmission. The procedure was repeated up to three times as specified below.

Film Examples 1 to 4 and Comparative Examples A and B

Mixtures of Copolymer Examples 1 to 5 and Copolymer 6 and, for comparison, 2-(4,6-diphenyl-1,3,5-triazin-2-yl-)-5-((hexyl)oxyphenol and 2-[4-[(2-hydroxy-3-(2'-ethyl) hexyl)oxy]-2-hydroxyphenyl]-4,6-bis(2,4-dimethylphenyl)-1,3,5-triazine (obtained from BASF, Florham Park, N.J., under the trade designations "TINUVIN 1577" and "TINUVIN 405", respectively) were each compounded with PVDF (obtained from Inner Mongolia Wanhao Fluorochemical Induestry Co., Ltd., China, under the trade designation "WANHAO 906") on a scale of up to 85 grams in a mixer obtained from Brabender, Duisburg, Germany. The oligomers and comparative UV absorbers were added such that the active UV absorbers made up 2% by weight of the batches. Oligomers were added at 10% by weight to provide 2% by weight of the active UV absorbing monomeric unit in the batch. The compounded mixtures were hot pressed typically into 7 mil (0.18 mm thick) film patches.

Haze and clarity were measured according to the methods described above, and average transmission over a range from 400 nm to 1150 nm were measured using a spectrophotometer (a "LAMBDA 900" Spectrophotometer obtained from Lambda Scientific, Edwardstown, SA, Australia) initially and after Accelerated Ultraviolet Light Exposure for a total of three intervals and Heat with Humidity (85/85) for a total of three cycles for Film Examples 1 to 3. For Film Example 4, two exposure intervals for Accelerated Ultraviolet Light Exposure and two exposure cycles to Heat and Humidity were carried out. The results are shown in Table 5, below.

TABLE 5

| Film Example UVA | | Control (100% PVDF) none | Comp. Ex. 1 "TINUVIN 405" | Comp. Ex. 2 "TINUVIN 1577" | Film Ex. 1 Copolymer Ex. 1 | Film Ex. 2 Copolymer Ex. 2 | Film Ex. 3 Copolymer Ex. 3 | Film Ex. 4 Copolymer 6 |
|---|---|---|---|---|---|---|---|---|
| Initial | Haze % | 36.1 | 97.1 | 100 | 61.4 | 65.4 | 47.0 | 38.2 |
| 85/85 | Haze % | 53.0 | 99.2 | 101 | 64.4 | 62.2 | 52.0 | 37.1 |
| UV Exp. | Haze % | 41.7 | 97.6 | 101 | 62.2 | 53.7 | 54.1 | 27.4 |
| Initial | Clarity % | 95.1 | 74.6 | 72.6 | 93.6 | 86.3 | 87.1 | 96.7 |
| 85/85 | Clarity % | 91.8 | 63.9 | 19.9 | 92.8 | 74.0 | 85.4 | 94.6 |
| UV Exp. | Clarity % | 93.5 | 65.7 | 64.2 | 91.2 | 83.3 | 86.0 | 96.2 |
| Initial | Ave T % | 92.6 | 82.7 | 68.3 | 82.2 | 87.7 | 92.9 | 91.2 |
| 85/85 | Ave T % | 92.6 | 75.0 | 61.3 | 75.0 | 88.6 | 86.1 | 86.8 |
| UV Exp. | Ave T % | 92.55 | 80.0 | 63.3 | 92.9 | 92.6 | 85.7 | 90.6 |

Copolymer Examples 1 to 5 and Copolymer 6 were extrusion compounded with PVDF homopolymer (obtained from Inner Mongolia Wanhao Fluorochemical Industry Co., Ltd., China, under the trade designation "WANHAO 906") using a 25 mm twin screw extruder obtained from Krauss-Maffei Berstorff (Hannover, Germany) and pelletized into PVDF-UVA masterbatch pellets at the extrusion rates and process conditions shown in Table 6. The copolymers were included such that the composition included the copolymers at 4 percent by weight, based on the weight of the composition. For each extrusion, the temperature was 400° F. to 475° F. (204° C. to 246° C.).

TABLE 6

| UVA | Copolymer Ex. 2 | Copolymer Ex. 1 | Copolymer Ex. 3 | Copolymer 6 | Copolymer Ex. 4 |
|---|---|---|---|---|---|
| PVDF rate in lbs/hr (kg/hr) | 4.0 (1.8) | 4.0 (1.8) | 4.0 (1.8) | 8.0 (3.6) | 4.0 (1.8) |
| UVA rate in lbs/hr (kg/hr) | 1.0 (0.45) | 1.0 (0.45) | 1.0 (0.45) | 2.0 (0.91) | 1.0 (0.45) |
| Extruder Screw Speed (rpm) | 203 | 203 | 254 | 354 | 254 |
| Polymer Melt temperature in °F. (°C.) | 486 (252) | 475 (246) | 472 (244) | 468 (242) | 469 (243) |
| Extruder Gate Pressure in psi (Pa) | 40 ($2.8 \times 10^5$) | 36 ($2.5 \times 10^5$) | 48 ($3.8 \times 10^5$) | 78 ($5.4 \times 10^5$) | 50 ($3.4 \times 10^5$) |
| Extruder Amps | 13 | 13 | 14 | 18 | 16 |
| Extruder Volts | 77 | 77 | 96 | 134 | 96 |

For comparison, a triazine UV absorber obtained from BASF under the trade designation "TINUVIN 1600" was also extrusion compounded into PVDF at similar process conditions as shown above. These comparative polymer strands were very hazy and difficult to pelletize.

The masterbatch pellets made as shown in Table 6 were extrusion compounded with PVDF homopolymer obtained from 3M Company, St. Paul, Minn. under the trade designation "DYNEON 6008" and extruded into 50 micrometer thick film using a 25 mm single screw extruder obtained from Davis-Standard, Pawcatuck, Conn., having an extruder screw designed with a Maddock Mixer. The extrusion rates and process conditions were as shown in Table 7. Again, the final UVA wt % in the film referred to in Table 7 refers to the wt % of the active UV absorbing unit in the oligomer. Oligomers were added at 10% by weight to provide 2% by weight of the active UV absorbing monomeric unit in the film, 5% by weight to provide 1% by weight of the active UV absorbing monomeric unit in the film, and so on.

TABLE 7

| PVDF Type | UVA Type | PVDF Rate, lbs/hr (kg/hr) | UVA MB Rate, lbs/hr (kg/hr) | Final UVA wt % in Film | Extruder Screw Speed (rpm) | Line Speed (fpm) |
|---|---|---|---|---|---|---|
| Comp. Ex. 3 | None | 10 (4.5) | 10 (4.5) | 0.0 | 46 | 26 |
| Film Ex. 5 | Copolymer Example 3 | 10 (4.5) | 10 (4.5) | 2.0 | 46 | 26 |

TABLE 7-continued

| PVDF Type | UVA Type | PVDF Rate, lbs/hr (kg/hr) | UVA MB Rate, lbs/hr (kg/hr) | Final UVA wt % in Film | Extruder Screw Speed (rpm) | Line Speed (fpm) |
|---|---|---|---|---|---|---|
| Film Ex. 6 | Copolymer Example 1 | 10 (4.5) | 10 (4.5) | 2.0 | 46 | 26 |
| Film Ex. 7 | Copolymer Example 4 | 10 (4.5) | 10 (4.5) | 2.0 | 46 | 26 |
| Film Ex. 8 | Copolymer Example 2 | 10 (4.5) | 10 (4.5) | 2.0 | 46 | 26 |
| Film Ex. 9 | Copolymer 6 Copolymer Example 4 | 10 (4.5) | 5 (2.3) 5 (2.3) | 1.0 1.0 | 46 | 26 |
| Film Ex. 10 | Copolymer Example 2 Copolymer 6 | 10 (4.5) | 5 (2.3) 5 (2.3) | 1.0 1.0 | 46 | 26 |
| Film 11 | Copolymer 6 | 10 (4.5) | 10 (4.5) | 2.0 | 46 | 26 |
| Film Ex. 12 | Copolymer Example 2 Copolymer 4 Copolymer 6 | 10 (4.5) | 5 (2.3) 2.5 (1.1) 5 (2.3) | 0.8 0.4 0.8 | 46 | 26 |

Film Examples 5 and 8 were non-uniform in color, haze, and had numerous holes. The addition of Copolymer 6 provided surprisingly good quality Film Example 10, which had uniform color, haze, and flat caliper.

Average transmission over a range from 250 nm to 2500 nm for Comparative Example 3 and Film Examples 6, 7, 9, and 12 and Film 11 were measured using a "LAMBDA 950" Spectrophotometer obtained from Lambda Scientific before and after Accelerated Ultraviolet Light Exposure for three intervals according to the method described above. The results are shown in Table 8, below.

TABLE 8

| Film Example | Avg. Transmission 400 nm-800 nm (%) | | Avg. Transmission 400 nm-500 nm (%) | | Avg. Transmission 300 nm to 395 nm (%) | |
|---|---|---|---|---|---|---|
| | initial | 3 intervals | initial | 3 intervals | initial | 3 intervals |
| Comp. Ex. 3 | 90.3 | 89.0 | 89.9 | 87.2 | 66.4 | 61.6 |
| Film Ex. 6 | 84.8 | 85.5 | 81.3 | 82.3 | 14.7 | 20.1 |
| Film Ex. 7 | 89.3 | | 88.2 | | 13.5 | |
| Film Ex. 9 | 88.8 | 89.2 | 87.2 | 88.1 | 15.0 | 23.1 |
| Film Ex. 12 | 88.8 | 88.1 | 87.2 | 86.7 | 15.5 | 25.8 |
| Film 11 | 88.9 | 90.2 | 87.3 | 89.3 | 18.7 | 30.1 |

Film Example 13

Film Example 13 was made using the method of Film Examples 1 to 4 except using Copolymer Example 5 as the copolymer. Films were made having a thickness of about 3.5 to 3.6 mils (0.089 to 0.091 mm) Table 9 below shows transmission, haze, and clarity data for 2 samples of Film Example 13 13 initially and after one interval of Accelerated Ultraviolet Light Exposure. The methods described in Film Examples 1 to 4 above were used.

TABLE 9

|   | % Transmission 400-1150 nm | | | % Haze | | | % Clarity | | |
|---|---|---|---|---|---|---|---|---|---|
|   | Initial | 1 interval | change | Initial | 1 interval | change | Initial | 1 interval | change |
| 1 | 93 | 93.1 | 0 | 65.5 | 66.6 | 1.1 | 83.5 | 79.8 | −3.7 |
| 2 | 91.8 | 92.4 | 1.3 | 55.4 | 55.4 | 0 | 80.8 | 75.5 | −5.3 |

Various modifications and alterations of this disclosure may be made by those skilled the art without departing from the scope and spirit of the disclosure, and it should be understood that this invention is not to be unduly limited to the illustrative embodiments set forth herein.

What is claimed is:

1. A copolymer comprising:
a first divalent unit comprising a pendent ultraviolet absorbing group comprising a triazine; and
a second divalent unit represented by formula:

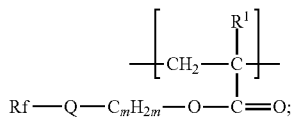

wherein
Rf represents a fluoroalkyl group having from 1 to 6 carbon atoms optionally interrupted by one —O— group, or Rf represents a polyfluoropolyether group;
$R^1$ is hydrogen or methyl;
Q is a bond, —SO$_2$—N(R)—, or —C(O)—N(R)—, wherein R is alkyl having from 1 to 4 carbon atoms or hydrogen; and
m is an integer from 0 to 11,
wherein the copolymer is a thermoplastic copolymer.

2. The copolymer of claim 1, wherein the first divalent unit is represented by formula:

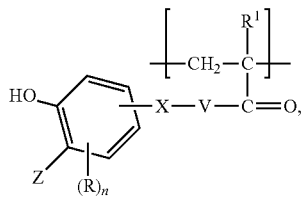

wherein
$R^1$ is hydrogen or methyl;
V is O or NH;
X is alkylene or alkyleneoxy group having from 1 to 10 carbon atoms and optionally interrupted by one or more —O— groups and optionally substituted by a hydroxyl group;

R is alkyl having from one to four carbon atoms;
n is 0 or 1; and
Z is a 4,6-bisphenyl[1,3,5]triazin-2-yl group, wherein the 4,6-bisphenyl[1,3,5]triazin-2yl group, is optionally substituted by one or more alkyl, aryl, alkoxy, hydroxyl, or halogen substituents, or a combination of these substituents.

3. The copolymer of claim 1, wherein Rf represents a perfluoroalkyl group having up to 4 carbon atoms.

4. The copolymer of claim 1, further comprising a third divalent unit represented by formula:

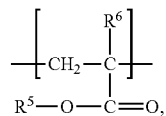

wherein
$R^6$ is hydrogen or methyl; and
$R^5$ is alkyl having from 1 to 4 carbon atoms.

5. The copolymer of claim 1, wherein the second divalent unit is present in the copolymer in an amount of up to 50 percent by weight, based on the total weight of the copolymer.

6. A composition comprising a fluoropolymer and the copolymer of claim 1.

7. The composition of claim 6, further comprising poly (methyl methacrylate).

8. The composition of claim 6, wherein the fluoropolymer is present in the composition in an amount of at least 50 percent by weight, based on the total weight of the composition.

9. The composition of claim 6, further comprising a second copolymer comprising the first divalent unit and at least one of the second divalent unit or a third divalent unit represented by formula:

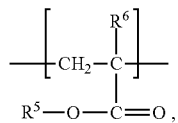

wherein
$R^6$ is hydrogen or methyl; and
$R^5$ is alkyl having from 1 to 4 carbon atoms.

10. The composition of claim 9, wherein the copolymer and the second copolymer are present in the composition in an amount up to 20 percent combined weight, based on the total weight of the composition.

11. The composition of claim 6, wherein the composition is essentially free of volatile organic solvent.

12. The composition of claim 6, wherein the fluoropolymer is selected from the group consisting of ethylene-tetrafluoroethylene copolymer, a tetrafluoroethylene-hexafluoropropylene copolymer, a tetrafluoroethylene-hexafluoropropylene-vinylidene fluoride copolymer, or polyvinylidene fluoride.

13. The composition of claim 6 in the form of a film.

14. A photovoltaic device comprising the composition of claim 6.

15. The composition of claim 13, wherein the film is a multilayer film.

16. A composition comprising:

a fluoropolymer;

a copolymer comprising:

a first divalent unit comprising a pendent ultraviolent absorbing group; and a second divalent unit represented by formula:

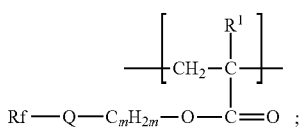

wherein

Rf represents a fluoroalkyl group having from 1 to 6 carbon atoms optionally interrupted by one —O— group, or Rf represents a polyfluoropolyether group;

$R^1$ is hydrogen or methyl;

Q is a bond, —SO$_2$—N(R)—, or —C(O)—N(R)—, wherein R is alkyl having from 1 to 4 carbon atoms or hydrogen; and m is an integer from 0 to 11, wherein the copolymer is a thermoplastic copolymer; and a second copolymer, wherein the second copolymer is a copolymer of methyl methacrylate and an acrylate- or methacrylate-functional ultraviolet absorbing group.

17. The copolymer of claim 1, wherein the copolymer is an oligomer with a number average molecular weight of up to 50,000 grams per mole.

18. The copolymer of claim 17, wherein the oligomer has a number average molecular weight greater than 5000 grams per mole.

19. The composition of claim 16, wherein the pendent ultraviolet absorbing group comprises a triazine, a benzophenone, or a benzotriazole.

20. The composition of claim 16, further comprising poly(methyl methacrylate).

* * * * *

UNITED STATES PATENT AND TRADEMARK OFFICE
CERTIFICATE OF CORRECTION

PATENT NO. : 9,670,300 B2  
APPLICATION NO. : 14/654121  
DATED : June 6, 2017  
INVENTOR(S) : David Olson et al.

It is certified that error appears in the above-identified patent and that said Letters Patent is hereby corrected as shown below:

In the Specification

Column 20
Line 13 (approx.), delete "funnel" and insert -- funnel. --, therefor.
Line 16 (approx.), delete "funnel" and insert -- funnel. --, therefor.
Line 41 (approx.), delete "funnel" and insert -- funnel. --, therefor.

Column 21
Line 19 (approx.), delete "funnel" and insert -- funnel. --, therefor.
Line 21 (approx.), delete "funnel" and insert -- funnel. --, therefor.

Column 22
Line 2, delete "funnel" and insert -- funnel. --, therefor.

Column 23
Line 19 (approx.), delete "7 8" and insert -- 7.8 --, therefor.

Column 31
Line 6, delete "mm)" and insert -- mm). --, therefor.

In the Claims

Column 33
Line 15 (approx.), in Claim 16, delete "ultraviolent" and insert -- ultraviolet --, therefor.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*